(12) United States Patent
Henley

(10) Patent No.: US 8,153,513 B2
(45) Date of Patent: Apr. 10, 2012

(54) METHOD AND SYSTEM FOR CONTINUOUS LARGE-AREA SCANNING IMPLANTATION PROCESS

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 1052 days.

(21) Appl. No.: 11/782,289

(22) Filed: Jul. 24, 2007

(65) Prior Publication Data

US 2008/0038908 A1    Feb. 14, 2008

Related U.S. Application Data

(60) Provisional application No. 60/833,289, filed on Jul. 25, 2006, provisional application No. 60/829,147, filed on Oct. 11, 2006, provisional application No. 60/825,104, filed on Sep. 8, 2006, provisional application No. 60/826,731, filed on Sep. 22, 2006.

(51) Int. Cl.
    *H01L 21/425* (2006.01)
(52) U.S. Cl. .................. 438/528; 438/510; 414/217
(58) Field of Classification Search .............. 438/510, 438/527, 528; 414/217
    See application file for complete search history.

(56) References Cited

U.S. PATENT DOCUMENTS

| | | |
|---|---|---|
| 2,981,877 A | 4/1961 | Noyce |
| 4,363,828 A | 12/1982 | Brodsky et al. |
| 4,367,411 A | 1/1983 | Hanley et al. |
| 4,585,671 A | 4/1986 | Kitagawa et al. |
| 4,696,758 A | 9/1987 | Ovshinsky et al. |

(Continued)

FOREIGN PATENT DOCUMENTS

JP   62-188150 A   8/1987

(Continued)

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

(Continued)

*Primary Examiner* — Bradley K Smith
(74) *Attorney, Agent, or Firm* — Kilpatrick Townsend and Stockton LLP

(57) ABSTRACT

A method for manufacturing doped substrates using a continuous large area scanning implantation process is disclosed. In one embodiment, the method includes providing a movable track member. The movable track member is provided in a chamber. The chamber includes an inlet and an outlet. In a specific embodiment, the movable track member can include one or more rollers, air bearings, belt member, and/or movable beam member to provide one or more substrates for a scanning process. The method may also include providing a first substrate. The first substrate includes a first plurality of tiles. The method maintains the first substrate including the first plurality of tiles in a vacuum. The method includes transferring the first substrate including the first plurality of tiles from the inlet port onto the movable track member. The first plurality of tiles are subjected to a scanning implant process. The method also includes maintaining a second substrate including a second plurality of tiles in the vacuum. The method includes transferring the second substrate including a second plurality of tiles from the inlet port onto the movable track member. The method includes subjecting the second plurality of tiles to an implant process using the scanning implant process.

31 Claims, 20 Drawing Sheets

U.S. PATENT DOCUMENTS

| | | | |
|---|---|---|---|
| 4,799,392 A | 1/1989 | Wilson et al. | |
| 4,980,562 A | 12/1990 | Berrian et al. | |
| 4,981,408 A | 1/1991 | Hughes et al. | |
| 5,120,394 A | 6/1992 | Mukai | |
| 5,132,544 A | 7/1992 | Glavish | |
| 5,196,710 A | 3/1993 | Kalfaian | |
| 5,311,028 A | 5/1994 | Glavish | |
| 5,393,984 A | 2/1995 | Glavish | |
| 5,438,203 A | 8/1995 | Glavish et al. | |
| 5,481,116 A | 1/1996 | Glavish et al. | |
| 5,483,077 A | 1/1996 | Glavish | |
| 5,672,879 A | 9/1997 | Glavish | |
| 5,789,030 A | 8/1998 | Rolfson | |
| 5,877,070 A | 3/1999 | Göesele et al. | |
| 6,013,563 A | 1/2000 | Henley et al. | |
| 6,033,974 A | 3/2000 | Henley et al. | |
| 6,100,166 A | 8/2000 | Sakaguchi et al. | |
| 6,103,599 A | 8/2000 | Henley et al. | |
| 6,162,705 A | 12/2000 | Henley et al. | |
| 6,171,965 B1 | 1/2001 | Kang et al. | |
| 6,180,496 B1 | 1/2001 | Farrens et al. | |
| 6,207,964 B1 | 3/2001 | McIntyre et al. | |
| 6,245,161 B1 | 6/2001 | Henley et al. | |
| 6,287,941 B1 | 9/2001 | Kang et al. | |
| 6,313,475 B1 | 11/2001 | Renau et al. | |
| 6,368,930 B1 | 4/2002 | Enquist | |
| 6,391,740 B1 | 5/2002 | Cheung et al. | |
| 6,455,399 B2 | 9/2002 | Malik et al. | |
| 6,500,694 B1 | 12/2002 | Enquist | |
| 6,534,381 B2 | 3/2003 | Cheung et al. | |
| 6,558,802 B1 | 5/2003 | Henley et al. | |
| 6,563,133 B1 | 5/2003 | Tong | |
| 6,586,785 B2 | 7/2003 | Flagan | |
| 6,627,531 B2 | 9/2003 | Enquist | |
| 6,653,212 B1 | 11/2003 | Yamanaka et al. | |
| 6,696,688 B2 | 2/2004 | White et al. | |
| 6,699,531 B1 | 3/2004 | Fukiage | |
| 6,716,751 B2 | 4/2004 | Todd | |
| 6,723,606 B2 | 4/2004 | Flagan | |
| 6,740,909 B2 | 5/2004 | Enquist | |
| 6,756,281 B2 | 6/2004 | Enquist | |
| 6,771,410 B1 | 8/2004 | Bourianoff | |
| 6,804,062 B2 | 10/2004 | Atwater | |
| 6,818,529 B2 | 11/2004 | Bachrach | |
| 6,821,825 B2 | 11/2004 | Todd et al. | |
| 6,822,326 B2 | 11/2004 | Enquist et al. | |
| 6,858,107 B2 | 2/2005 | Ghyselen et al. | |
| 6,858,517 B2 | 2/2005 | Martinez et al. | |
| 6,864,585 B2 | 3/2005 | Enquist | |
| 6,867,073 B1 | 3/2005 | Enquist | |
| 6,875,671 B2 | 4/2005 | Farris | |
| 6,881,966 B2 | 4/2005 | Benveniste et al. | |
| 6,884,696 B2 | 4/2005 | Aga et al. | |
| 6,900,115 B2 | 5/2005 | Todd | |
| 6,902,987 B1 | 6/2005 | Tong et al. | |
| 6,903,349 B2 | 6/2005 | Mitchell et al. | |
| 6,905,557 B2 | 6/2005 | Enquist | |
| 6,930,316 B2 | 8/2005 | Nishihashi et al. | |
| 6,956,225 B1 | 10/2005 | Benveniste | |
| 6,962,858 B2 | 11/2005 | Neyret et al. | |
| 6,962,859 B2 | 11/2005 | Todd et al. | |
| 6,987,272 B2 | 1/2006 | Ota et al. | |
| 6,987,572 B2 | 1/2006 | Lakkapragada et al. | |
| 7,019,339 B2 | 3/2006 | Atwater et al. | |
| 7,029,995 B2 | 4/2006 | Todd et al. | |
| 7,205,204 B2 | 4/2007 | Ogawa et al. | |
| 7,371,660 B2 | 5/2008 | Henley et al. | |
| 7,674,687 B2* | 3/2010 | Henley | 438/459 |
| 2001/0007367 A1* | 7/2001 | Ohkubo | 257/347 |
| 2001/0024837 A1 | 9/2001 | Streubel | |
| 2002/0029849 A1 | 3/2002 | Ohmi et al. | |
| 2002/0168868 A1 | 11/2002 | Todd | |
| 2002/0173113 A1 | 11/2002 | Todd | |
| 2002/0190269 A1 | 12/2002 | Atwater | |
| 2002/0197831 A1 | 12/2002 | Todd et al. | |
| 2003/0045131 A1 | 3/2003 | Verbeke et al. | |
| 2003/0082300 A1 | 5/2003 | Todd et al. | |
| 2003/0095340 A1 | 5/2003 | Atwater | |
| 2003/0111013 A1 | 6/2003 | Oosterlaken et al. | |
| 2003/0123958 A1* | 7/2003 | Sieradzki et al. | 414/217 |
| 2003/0129545 A1 | 7/2003 | Kik | |
| 2003/0216008 A1 | 11/2003 | Schwarzenbach et al. | |
| 2003/0230629 A1 | 12/2003 | Bourianoff | |
| 2003/0230778 A1 | 12/2003 | Park et al. | |
| 2004/0056332 A1 | 3/2004 | Bachrach et al. | |
| 2004/0126985 A1 | 7/2004 | Bendernagel et al. | |
| 2004/0171196 A1 | 9/2004 | Walitzki | |
| 2004/0214434 A1 | 10/2004 | Atwater | |
| 2004/0229444 A1 | 11/2004 | Couillard et al. | |
| 2005/0026400 A1 | 2/2005 | Todd et al. | |
| 2005/0026432 A1 | 2/2005 | Atwater | |
| 2005/0054217 A1 | 3/2005 | Klomp et al. | |
| 2005/0077486 A1 | 4/2005 | Schenkel et al. | |
| 2005/0085049 A1 | 4/2005 | Atwater | |
| 2005/0092235 A1 | 5/2005 | Brabant et al. | |
| 2005/0121627 A1 | 6/2005 | Sheng et al. | |
| 2005/0142879 A1 | 6/2005 | Atwater | |
| 2005/0153524 A1 | 7/2005 | Maa et al. | |
| 2005/0208740 A1 | 9/2005 | Todd | |
| 2005/0247924 A1 | 11/2005 | Atwater | |
| 2005/0250302 A1 | 11/2005 | Todd et al. | |
| 2005/0266658 A1 | 12/2005 | Couillard et al. | |
| 2005/0272222 A1 | 12/2005 | Flamand | |
| 2005/0275067 A1 | 12/2005 | Atwater | |
| 2006/0019464 A1 | 1/2006 | Maa et al. | |
| 2006/0021565 A1 | 2/2006 | Zahler et al. | |
| 2006/0024435 A1 | 2/2006 | Holunga | |
| 2006/0030124 A1 | 2/2006 | Maa et al. | |
| 2006/0060943 A1 | 3/2006 | Mohamed et al. | |
| 2006/0071213 A1 | 4/2006 | Ma et al. | |
| 2006/0088985 A1 | 4/2006 | Haverkort et al. | |
| 2006/0108688 A1 | 5/2006 | Richardson | |
| 2006/0112986 A1 | 6/2006 | Atwater | |
| 2007/0170369 A1 | 7/2007 | Purser et al. | |
| 2007/0194252 A1 | 8/2007 | Horsky et al. | |
| 2007/0243049 A1* | 10/2007 | Ferrara | 414/217 |

FOREIGN PATENT DOCUMENTS

| | | |
|---|---|---|
| JP | 11-045840 A | 2/1999 |
| JP | 2009-530833 A | 8/2009 |
| WO | WO 99/08316 A1 | 2/1999 |
| WO | WO 2007/109568 A2 | 9/2007 |
| WO | WO 2007/114974 A2 | 10/2007 |
| WO | WO 2007/118121 A2 | 10/2007 |
| WO | WO 2008/014339 A2 | 1/2008 |
| WO | WO 2009/046306 A1 | 4/2009 |

OTHER PUBLICATIONS

Agarwal et. al., Efficient Production of Silicon-on-Insulator Films by Co-Implantation of the He+ with H+, Applied Physics, Mar. 2, 1998, Letters, vol. 72, No. 9.

Ahn et al., Growth, shrinkage, and stability of Interfacial Oxide Layers Between Directly Bonded Silicon Wafers. Appl. Phys A, Jan. 1990, 50 (1), pp. 85-94; Abstract.

Ahn et al.,Stability of Interfacial Oxide Layers during Silicon Wafer Bonding, Journal of Applied Physics, 65(2), Jan. 15, 1989, pp. 561-563.

Bennett et al., Complete Surface Exfoliation of 4H-SiC by H+—and Si+ Coimplantation, Applied Physics Letters, vol. 76, No. 22, May 29, 2000.

Bourdelle et al., Fabrication of Directly Bonded Si Substrates with Hybrid Crystal Orientation for Advanced Bulk CMOS Technology, ECS Transactions, 3(4) 409-415 (2006).

Brendel, A Novel Process for Ultrathin Monocrystalline Silicon Solar Cells on Glass, 14th European Photovoltaic Solar Energy Conference, Jun. 30 To Jul. 4, 1997, Barcelona, Spain.

Brendel, Crystalline Thin-film Silicon Solar Cells from Layer-Transfer Processes: A Review, Proc. 10th Workshop on Crystalline Silicon Solar Cell Materials and Processes, Aug. 13-16, 2000, Copper Mountain, USA, ed. By B.L. Sopori, (NREL, Golden, 2000).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005.

Deng et. al., High Efficiency and High Rate Deposited Amorphous Silicon-Based Solar Cells, Phase II, Annual Technical Progress Report, Sep. 1, 2002 to Aug. 31, 2003, NREL Subcontract No. NDY-2-30630-08.

Du et. al., Impact of Hydrogen Dilution on Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr. et al., Chemical Vapor Deposition of Boron-Doped Hydrogenated Amorphous Silicon, Appl. Phys. Lett 47 (2) Jul. 15, 1985, p. 135-137.

Feijoo et al., Prestressing of Bonded Wafers. Proceedings of the First International Symposium on Semiconductor Wafer Bonding Science, Technology and Applications, The Electrochemical Society, vol. 92-7, New York, NY 1992.

Fournel., et al., Low Temperature Void Free Hydrophilic or Hydrophobic Silicon Direct Bonding, ECS Transactions, 3(6) 139-146 (2006).

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248.

Gui et al., Selective Wafer Bonding by Surface Roughness Control, Journal of the Electrochemical Society, 148 (4), G225-228, 2001.

Gui et al., The Effect of Surface Roughness on Direct Wafer Bonding, Journal of Applied Physics vol. 85, No. 10, May 15, 1999.

Hentinnen et al., Cold Ion-Cutting of Hydrogen Implanted Si, Nuclear Instruments and Methods in Physics Research B, 190, 761-766, 2002.

Huang et al., The Lower Boundary of the Hydrogen Concentration Required for Enhancing Oxygen Diffusion and Thermal Donor Formation in Czochralski Silicon, Journal of Applied Physics 98, 033511 (2005).

Huff et al., Silicon Materials Science and Technology, Electrochemical Society Proceedings vol. 98-1, pp. 1385-1394.

Hurley et al., Ion Implantation of Hydrogen and Helium into Silicon Wafers for Layer Transfer in Devices, Vacuum, 78, 167-175, 2005.

International Search Report and the Written Opinion corresponding to the PCT Application No. PCT/US07/60801, date of mailing Dec. 6, 2007, 7 pages total.

International Search Report and The Written Opinion corresponding to the PCT Application No. PCT/US07/64213, date of mailing Jul. 18, 2008, 8 pages total.

International Search Report and The Written Opinion corresponding to the PCT Application No. PCT/US07/65964, date of mailing Jul. 18, 2008, 8 pages total.

International Search Report and The Written Opinion corresponding to the PCT Application No. PCT/US08/078760, date of mailing Dec. 17, 2008, 13 pages total.

Joly, New Wafer to Wafer and Chip to Wafer Device Stacking Technology Implementations "3D Architectures for Semiconductor Integration and Packaging", Tempe AZ Jun. 13-15, 2005.

Kumata et al., Photochemical Vapor Deposition of Hydrogenated Amorphous Silicon Films from Disilane and Trisilane using a Low Pressure Mercury Lamp, Appl. Phys. Lett 48 (20), May 19, 1986, p. 1380.

Lee et al., Strained Silicon Thin-Film Transistors Fabricated on Glass, Applied Physics Letters, 86, 103504, Feb. 2005.

Ling et al., Relationship Between Interfacial Native Oxide Thickness and Bonding Temperature in Directly Bonded Silicon Wafer Pairs, Journal of Applied Physics 71 (3), Feb. 1, 1992, pp. 1237-1241.

Morrison et al., Deposition of Micro-Crystalline Silicon using a Graphite Filament in the Hot Wire CVD Technique, J. Vac. Sci. Technol A19 (6), Nov./Dec. 2001, p. 2817.

Reber et al., Progress in High Temperature Silicon Epitaxy using the RTCVD 160 Processor, presented at the 19th European Solar Energy Conference, Jun. 7-11, 2004, Paris.

Roth et al., "Kinetics of Solid Phase Epitaxy in Thick Amorphous Si Layers formed by MeV Ion Implantation", Appl. Phys. Lett 57 (13), Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Tung et al., CSDA Ranges of Electrons in Metals, Chinese Journal of Physics, vol. 17, No. 1, Spring 1979.

Venezia et al., The Role of Implantation Damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et al., 17.8% P type Heterojunction Silicon Solar Cells by HWCVD, National Renewable Energy Laboratory, Colorado, PowerPoint Presentation, Spring 2006.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/ Helium co-Implantation, Applied Physics Letter, vol. 73, No. 25, Dec. 21, 1998.

Weldon et al., On the Mechanism of the Hydrogen-Induced Exfoliation of Silicon, J. Vac. Science Tech. B, 15(4), Jul./Aug. 1997.

Yamazaki et al., Influence of Annealing Ambient on Oxygen Out-Diffusion in Czochralski Silicon, Journal of Applied Physics, vol. 87, No. 9, May 1, 2000, pp. 4194-4197.

International Search Report and Written Opinion of PCT Application No. PCT/US07/74352, dated Mar. 17, 2008, 19 pages total.

* cited by examiner

METHOD AND SYSTEM FOR CONTINUOUS LARGE-AREA SCANNING IMPLANTATION PROCESS

CROSS-REFERENCES TO RELATED APPLICATIONS

The instant nonprovisional patent application claims priority to the following provisional patent applications, each of which is incorporated by reference in its entirety herein for all purposes: U.S. Provisional Patent Application No. 60/833,289 filed Jul. 25, 2006; U.S. Provisional Patent Application No. 60/829,147, filed Oct. 11, 2006; U.S. Provisional Patent Application No. 60/825,104 filed Sep. 8, 2006; and U.S. Provisional Patent Application No. 60/826,731 filed Sep. 22, 2006

BACKGROUND OF THE INVENTION

Embodiments in accordance with the present invention relate generally to techniques including methods and a structure for forming substrates, including for example doped substrates, using a large scale implantation process. More particularly, embodiments of the present method and system provides a method and system using a scanning implant process for the manufacture of photovoltaic cells. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These polysilicon or single crystal silicon materials may be doped with impurities to form light absorbing regions.

These materials are often difficult to manufacture as implantation processes may be inefficient and not optimal for such application. Polysilicon cells are often formed by manufacturing polysilicon plates. Although these plates may be formed effectively, they do not possess optimum properties for highly effective solar cells.

Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystalline structure are less efficient than the more expensive bulk silicon cells made from single-crystal silicon substrates.

These and other limitations can be found throughout the present specification and more particularly below.

BRIEF SUMMARY OF THE INVENTION

According to embodiments of the present invention, techniques including a method, system, and a structure for forming substrates, including for example doped substrates, using a large scale implantation process are provided. More particularly, the present method and system provides a method and system using a scanning implant process for the manufacture of photovoltaic cells. In a preferred embodiment, such implanted impurities provide for a thickness of transferable material defined by a cleave plane in a donor substrate. For example, in photovoltaic applications, the thickness of transferable material may include implanted impurities that form p-n junctions and can be used as a light absorber layer, for example if the thickness of material has a sufficient thickness. In a specific embodiment, the thickness of material in these embodiments can be sufficient for effective thin-film solar cells and if thick enough, can even be used as a more cost-effective replacement for thick substrates made using current methods such as sawing and wafering processes. Thinner thickness of material can also be used as a single crystal template for a subsequent epitaxial growth process. But it will be recognized that the invention has a wider range of applicability; it can be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

In the field of three-dimensional packaging for example, the transfer of a film of sufficiently thick silicon onto a releasable mechanical silicon handle substrate would allow a commercially practical method of releasing a fully processed CMOS (e.g., integrated circuit or IC) layer onto a desired substrate or as part of a multiple layer structure that would make up a three-dimensional stacked or layered and interconnected CMOS planes. The released thin film containing the CMOS circuitry would have been defined by layer-transfer processes according to this invention where thicker films made possible by high-energy implantation would be particularly desirable. Such three-dimensional processes made using an implant/IC process/release methods are more fully explained in U.S. Pat. No. 6,291,314, commonly assigned, and hereby incorporated by reference herein.

In a specific embodiment, the present invention provides a method for manufacturing substrates using a continuous plasma immersion implant process or ion shower implantation process with varying degree of ion mass selection or non-mass selection. The method includes providing a movable track member. The movable track member is provided in a chamber. The chamber includes an inlet port and an outlet port. In a specific embodiment, the movable track member can include one or more rollers, air bearings, belt member, and/or movable beam member to provide one or more substrates for a scanning process. The method also includes providing a first substrate. The first substrate includes a first plurality of tiles. The method maintains the first substrate including the first plurality of tiles in a vacuum. The method includes transferring the first substrate including the first plurality of tiles from the inlet port onto the movable track member. The first plurality of tiles are subjected to a scanning implant process. The method also includes maintaining a second substrate including a second plurality of tiles in the inlet port while the first plurality of tiles are being implanted. The method includes transferring the second substrate including a second plurality of tiles from the inlet port onto the movable track member upon completion of the implantation of the first plurality of tiles. The method includes subjecting the second plurality of tiles to an implant process using the scanning implant process.

In a specific embodiment, the present invention provides a method for forming substrates for one or more layer transfer processes using a high energy linear accelerator process. The method includes providing a semiconductor substrate, which has a surface region. The method includes introducing a first plurality of particles through a first portion of the surface region using a high energy linear accelerator process to cause formation of a first selected cleave region within a first thickness of semiconductor material below the surface region. The method includes scanning the high energy linear accelerator process to a second portion of the surface region to introduce a second plurality of particles through a second portion of the surface region to cause formation of a second selected cleave region within a second thickness of semiconductor material below the surface region. The method continues the introduction of the plurality of particles through other portions of the surface region to cause formation of a cleave region including the first selected cleave region and the second selected cleave region. In a specific embodiment, the method includes cleaving the thickness of semiconductor material within a vicinity of the complete cleave region to remove the thickness of material from the semiconductor substrate.

In an alternative specific embodiment, the present invention provides a method for forming substrates using a scanning process. The method includes providing a movable track member. The method includes providing a substrate including a plurality of tiles onto the movable track member. The method includes maintaining the substrate in an inlet port provided by a chamber. The method also includes transferring the substrate including the plurality of tiles using the movable track to a vicinity of a first implant process. In a preferred embodiment, the first implant process includes a first scanning process characterized by a first gas, a first voltage, and a plurality of first ion species. The method also includes subjecting the plurality of tiles to a second implant process. In a preferred embodiment, the second implant process includes a second scanning process characterized by a second gas, a second voltage, and a plurality of second ion species. In a specific embodiment, the first implant process and the second implant process provide impurity regions within a thickness of material (which may be defined by a cleave plane) in each of the plurality of tiles.

In a specific embodiment of the present invention, a tray device for performing one or more implantation processes is provided. The tray device includes a frame member. The frame member includes a plurality of sites within a spatial region of the frame member. The plurality of sites can be arranged in an array configuration. For example, the array can have a six by six site configuration or an eight by eight configuration, among others. The plurality of sites may also be arranged to hold three by three 300 mm wafers, five by five 200 mm wafers, or six by six 150 mm wafers depending on the application. The tray device includes a tray member housed in the frame member to provide support for a plurality of reusable substrate members. Alternatively, the arrangement can be N×M or others. In a preferred embodiment, each of the reusable substrate member can include a substrate material such as a silicon bearing material, a germanium material, Group II/VI materials, Group III/V materials, and others. In a specific embodiment, the tray member is provided in an orientation to prevent defect to form on the reusable substrate members.

As merely an example, the tray member may be provided in a vertical position, or an upside-down position, or in an angled orientation in relation to a direction of implantation (e.g., direction of ions being implanted into the reusable substrates) in certain embodiments for controlling channeling effects of the implanted species into the reusable substrates. In silicon implantation for example, implant angle of approximately 7 degrees off of (100) surface normal is routinely utilized to reduce channeling effects of the implanted ions present during an implant along a major crystallographic direction. Alternatively, the reusable substrate can be cut at an angle off of the major crystallographic direction to accomplish the same result when implanted in a perpendicular implant geometry. In a specific embodiment, the tray can face a direction away from direct gravitational force, although there may be variations. In a preferred embodiment, the plurality of reusable substrates can be subjected to an scanning implant process. The plurality of reusable substrates may further be subjected to a bond and/or a controlled cleave process, together or separately. In a specific embodiment, the plurality of substrates may be processed to form p-n junctions in each of the plurality of substrates.

In a specific embodiment, each of the plurality of reusable substrate members can have an implant shield surrounding a peripheral region of each of the reusable substrate members. The implant shield may be amorphous silicon or other suitable materials. Accordingly, after cleaving, a cleave surface of the remaining reusable substrate member can be subjected to a polishing process in a specific embodiment. In other embodiments, the polishing process provides a flat surface for the remaining substrate member for further use.

In an alternative specific embodiment, the present invention provides a scanning implant apparatus using a plurality of tiles or the like to be processed. The apparatus has a movable track member, e.g., chain, mechanical movement device, belt drive and belt. The apparatus has at least a chamber coupled to the movable track member. In a preferred embodiment, the chamber is adapted to house a substrate and maintain the substrate including the plurality of tiles in a vacuum or other determined environment. In a specific embodiment, the apparatus has an implant device provided by at least the chamber coupled to the movable track member. The implant device is provided by subjecting the plurality of tiles to a plurality of particles using a first scanning process performed by movement of the substrate via the movable track member through the implant device provided by at least the chamber. Further details of the apparatus can be found throughout the present specification and more particularly below.

Numerous benefits are achieved over pre-existing techniques using embodiments of the present invention. In particular, embodiments of the present invention use a continuous mechanism including a movable track member and a tray device to provide an efficient method for scanning process. Such scanning process may include, but not limited to, an implantation process. In a preferred embodiment, the implantation process provides an impurity region in semiconductor substrate, for example in a thickness of transferable material defined by a cleave plane in a donor substrate. The implanted semiconductor substrate, for example the thickness of transferable material, may be further processed to provide a high quality semiconductor material for application such as photovoltaic devices, 3D MEMS, IC packaging, semiconductor devices, optoelectronic devices, and others. In a preferred embodiment, the present method provides for single crystal silicon for highly efficient photovoltaic cells among others. In an alternative preferred embodiment, embodiments according to the present invention may provide for a seed layer that can further provide for layering of a hetero-structure epitaxial process. The hetero-structure epitaxial process can be used to form thin multi-junction photovoltaic cells, among others. Merely as an example, GaAs and GaInP layers may be deposited heteroepitaxially onto a germanium seed layer, which is a transferred layer formed using an implant process according to an embodiment of the present invention Depending upon the embodiment, one or more of these benefits may be achieved. These and other benefits may be described throughout the present specification and more particularly below.

DETAILED DESCRIPTION OF THE INVENTION

Figure 1:
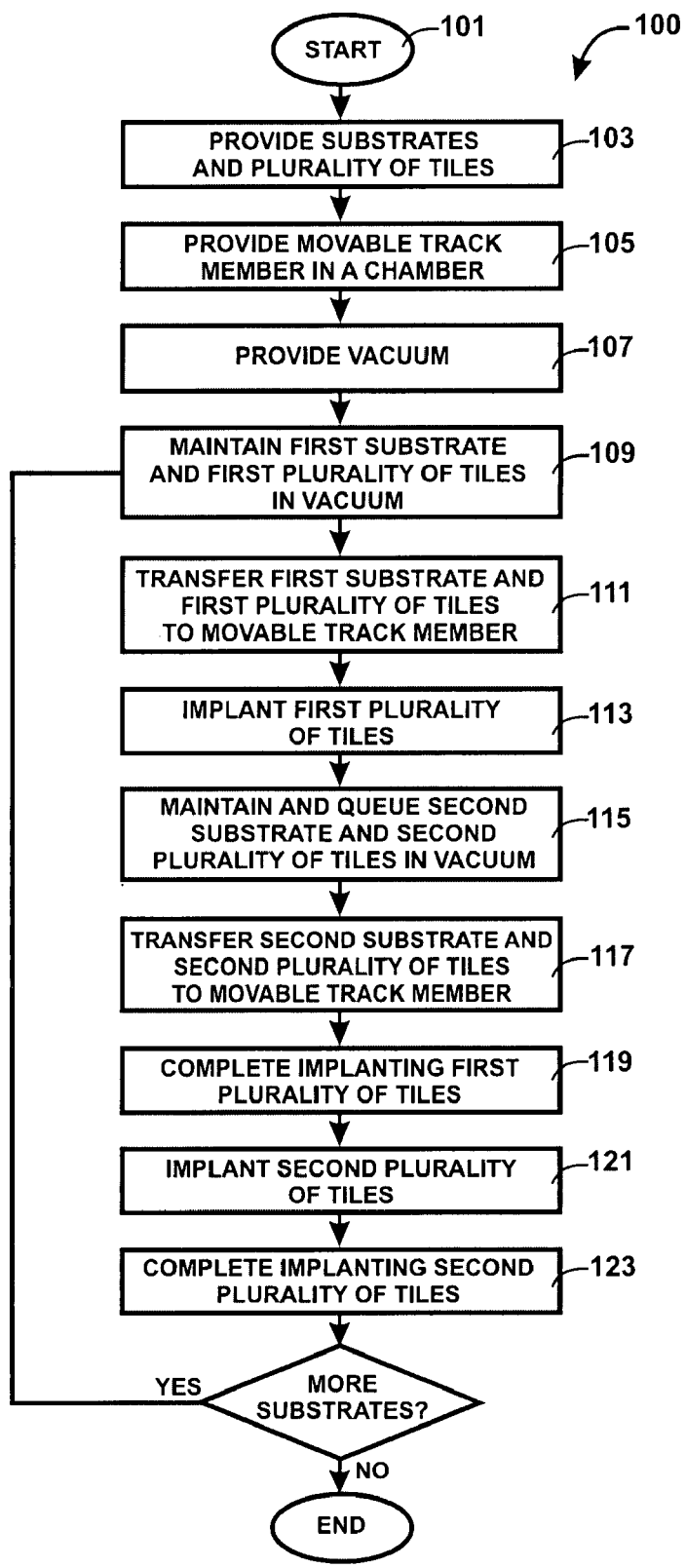
FIG. 1 is a simplified process flow diagram illustrating a method for forming substrates according to an embodiment of present invention.

According to embodiments of the present invention, techniques including a method and a system for forming substrates using a large scale implantation process are provided. More particularly, the present method and system provide a method and system using a scanning implant process for the manufacture of substrates, for example doped substrates as may be used as photovoltaic cells. In a preferred embodiment, such implanted process provide for impurity regions in a semiconductor substrate for fabrication of photovoltaic device. The impurity region may lie in a thickness of transferable material defined by a cleave plane in a donor substrate. But it will be recognized that the invention has a wider range of applicability; it can also be applied to other types of applications such as for providing impurity regions (active regions, source/drain engineering) in three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

In a specific embodiment, a method of forming substrates in a continuous process may be briefly outlined as follows:

1. Provide substrate members, each of the substrate members includes a plurality of tiles (e.g., reusable substrate, bulk silicon, bulk germanium, other materials or members);

2. Transfer a first substrate member including a first plurality of tiles onto a movable track member in a vacuum environment;

3. Maintain the first substrate member in the vacuum environment

4. Subject the first plurality of tiles to a scanning implant process;

5. Complete the scanning implant process for the first plurality of tiles;

6. Transfer a second substrate member including a second plurality of tiles into the movable track member in the vacuum environment;

7. Subject the second plurality of tiles to the scanning implant process;

8. Remove the first substrate member including the first plurality of tiles from the movable track member upon completion of the scanning implant process;

9. Remove the second substrate member including the second plurality of tiles from the movable track member upon completion of the scanning implant process;

10. Process other substrates as provided; and

11. Perform other steps, as desired.

The above sequence of steps provide a method of forming substrates using a continuous process according to an embodiment of the present invention. As shown, the method includes using a movable track member to transfer at least one substrate members including a plurality of tiles to be implanted in a scanning process, which occurs while the substrate is being moved spatially across a processing head of an implant device. The movable track member provides a continuous process for implanting a plurality of tiles provided on one or more than one substrate members. Other alternatives can also be provided where steps may be added, one or more steps may be removed, or one or more steps may be provided in a different sequence without departing from the scope of the claims herein. Further details of the present method can be found throughout the present specific and more particularly below.

As shown in FIG. 1, the method includes a start step 101. This diagram is merely an example and should not unduly limit the scope of the claims herein. One of ordinary skill in the art would recognize other variations, modifications, and alternatives. The method provides one or more substrate members (step 103). Each of the substrate members includes a plurality of tiles. In a specific embodiment, the substrate member can be a tray device, which will be described in more detail below. Alternatively, the substrate member can be any suitable member and/or device capable of holding more than two tiles, which are used as a material to be implanted. In a specific embodiment, the tray device can include mechanical, electrostatic, or other attachment members to hold the tiles in place. In a specific embodiment, the tiles are large portions of bulk substrate materials that can repeatedly be used for the manufacture of multilayered substrates using layer transfer techniques. Of course, there can be other variations, modifications, and alternatives.

In a specific embodiment, the method also provides a movable track in a chamber (step 105). As an example, the movable track can be a belt device or other suitable device that allow for the transportation of the substrate from a first spatial location to a second spatial location and other locations between the first and second locations. The movable track device is suitably designed to be coupled to an implant process, which is chamber based or other suitable device. The movable track member can include rollers, air bearing, belt, and/or a movable beam in certain embodiments. Of course, there can be other variations, modifications, and alternatives.

Referring again to FIG. 1, the method includes providing a vacuum environment (step 107) within a chamber that houses the movable track member. The method maintains a first substrate member includes a first plurality of tiles in the vacuum (step 109). In a specific embodiment, the first plurality of tiles may include semiconductor substrates such as silicon wafers and the like. The first vacuum may be provided using a load lock system but can others. The method transfers the first substrate member including the first plurality of tiles from an inlet of the chamber to the movable track member (step 111). The method includes subjecting the first plurality of tiles to an implant process (step 113).

In a specific embodiment the implant process can be provided by a plasma immersion implant (PIII) system. Other implant processes can include those using ion shower, ion beam, or other mass separated and/or mass non-separated techniques. Or course, there can be other variations, modifications, and alternatives.

The method includes maintaining and queuing a second substrate member including a second plurality of tiles in the vacuum environment (step 115) while the first plurality of tiles are being implanted. The method transfers the second substrate member including the second plurality of tiles to the movable track member. (step 117). The method includes subjecting the second plurality of tiles to the implant process (step 121) after completion of implanting the first plurality of tile (step 119). The method includes completing implantation of the second plurality of tiles (step 123) and continues to process other substrates as provided. Of course, there can be other variations, modifications, and alternatives.

The above sequence of steps provide a method of forming substrates using a continuous process according to an embodiment of the present invention. As shown, the method includes using a movable track member to transfer at least one substrate members including a plurality of tiles to be implanted in a scanning process, which occurs while the substrate is being moved spatially across a processing head of an implant device. The movable track member provides a continuous process for implanting a plurality of tiles provided on one or more than one substrate members. Other alternatives can also be provided where steps may be added, one or more steps may be removed, or one or more steps may be provided in a different sequence without departing from the scope of the claims herein. Other details of the present method and system can be found throughout the present specific and more particularly below.

Figure 2:
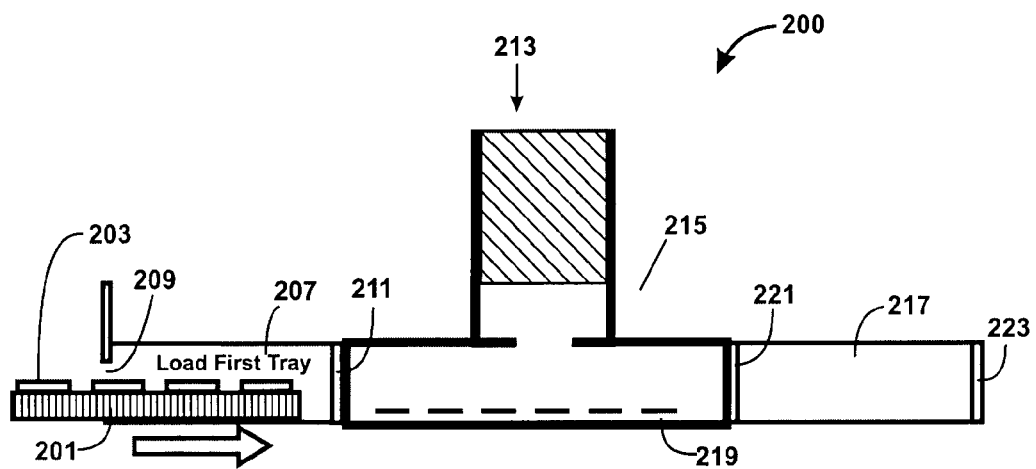
FIG. 2 is a simplified diagram illustrating a system for a continuous process for forming substrates according to an embodiment of the present invention.

FIG. 2 is an simplified diagram illustrating a system 200 for forming substrates using a continuous process according to an embodiment of the present invention. This diagram is merely an example and should not unduly limit the scope of the claims herein. One of ordinary skill in the art would recognize other variations, modifications, and alternatives. As shown in FIG. 2, the system includes providing at least one substrate members 201. Each of the substrate members includes a plurality of tiles 203 disposed thereon. In a specific embodiment, each of the plurality of tiles include semiconductor substrate such as silicon wafers. The system also includes an inlet port 207 and an outlet port 217. The inlet port and the outlet port may be provided using load lock systems in certain embodiments. The inlet port is provided to prepare and to temporarily store a substrate member including a plurality of tiles before subjecting the plurality of tiles to an implant process in an implant device 213. As shown, the implant device is housed in a process chamber 215. A first door 209 is provided to allow loading of a substrate member including a plurality of tiles to the inlet port. A inlet 211 is provided in between the inlet port and process chamber 215. An outlet door 221 is also provided between the process chamber 215 and outlet port 217. A second door 223 allows for removal of substrate members from the outlet port upon completion of an implant process. In a specific embodiment, the implant device provides a scanning implant process. Such implanting device can be a beam line ion implantation equipment manufactured from companies such as Applied Materials, Inc., and others. Alternatively implantation can be provided using a plasma immersion ion implantation (PIII) technique, ion shower, and other mass separated and/or non-mass separated techniques, which can be particularly effective for larger surface regions according to a specific embodiment. As shown, the implanting device includes an ion implant head 215 to provide for impurities to be implanted in the plurality of tiles. The system also includes a movable track member 219. The movable track member can include rollers, air bearing, or a movable track in certain embodiments. Movable track member 219 provides a spatial movement of the substrate member for the scanning implant process. Of course there can be other variations, modifications, and alternatives.

Figure 3:
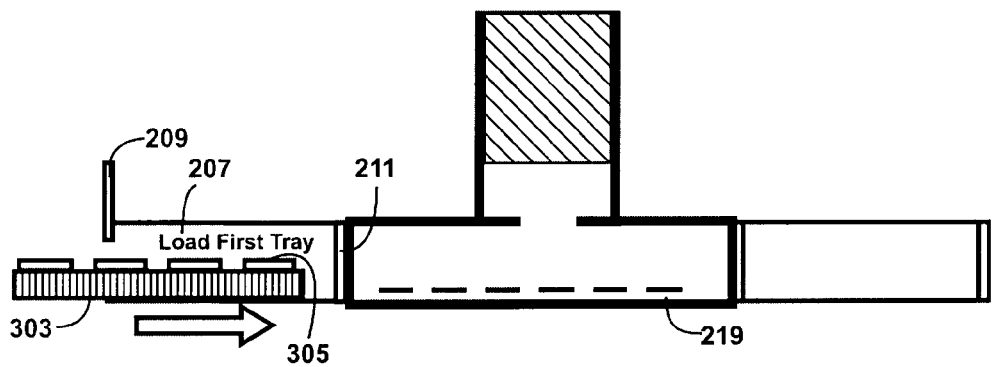
FIG. 3-10 is a simplified diagram illustrating a continuous process for forming substrates according to an embodiment of the present invention.
Figure 4:
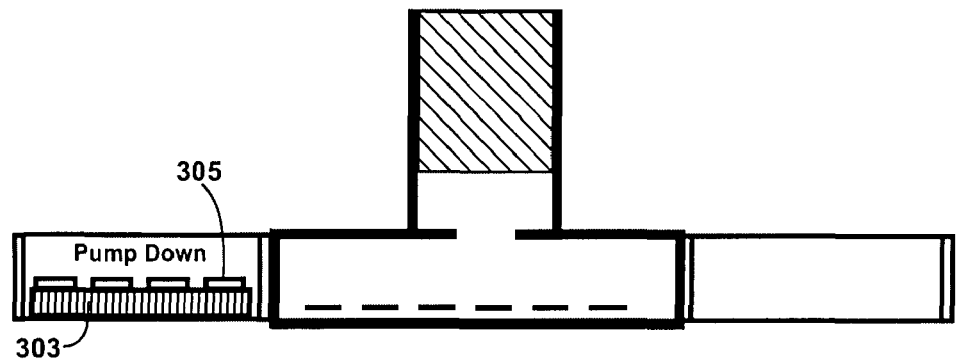
Figure 5:
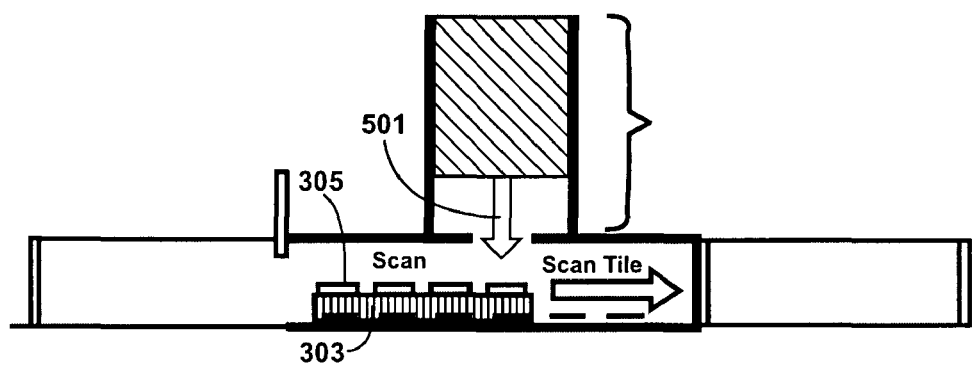
Figure 6:
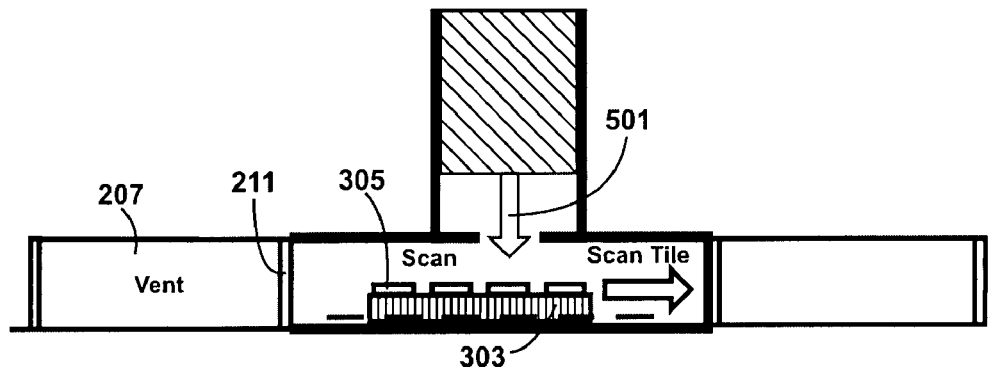

FIG. 3-10 illustrate a simplified method of forming substrates using a continuous process according to an embodiment of the present invention. These diagrams are merely examples and should not unduly limit the scope of the claims herein. One of ordinary skill in the art would recognize other variations, modifications, and alternatives. As shown in FIG. 3, at least one (N, N≧2) substrate members are provided. A first substrate member 303 including a first plurality of tiles 305 is transferred into in inlet port 207 through first door 209 (in an open position as shown) while inlet 211 to the implant process device remains closed. The first substrate member including the first plurality of tiles is maintained in an vacuum provided by the inlet port with the first front door closed to allow for a pump down process as shown in FIG. 4. Thereafter the first substrate member including the first plurality of tiles is transferred to a process chamber 215 which housed the implant device through the inlet using the movable track member as shown in FIG. 5

Figure 7:
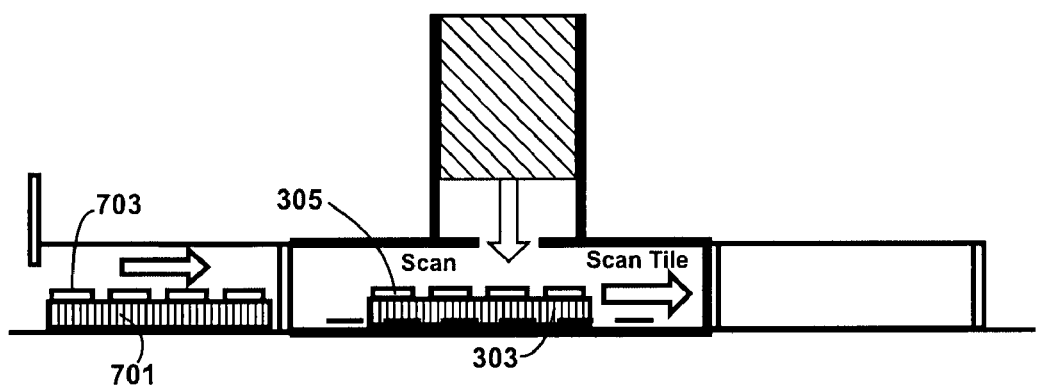
Figure 8:
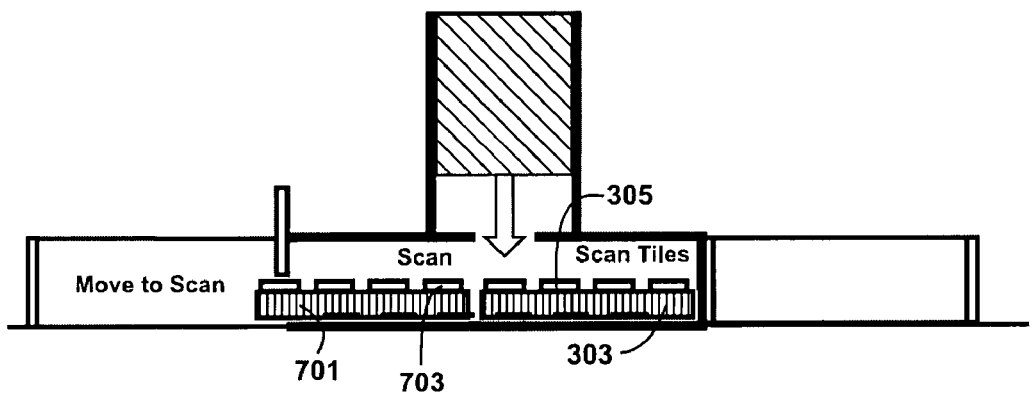
Figure 9:
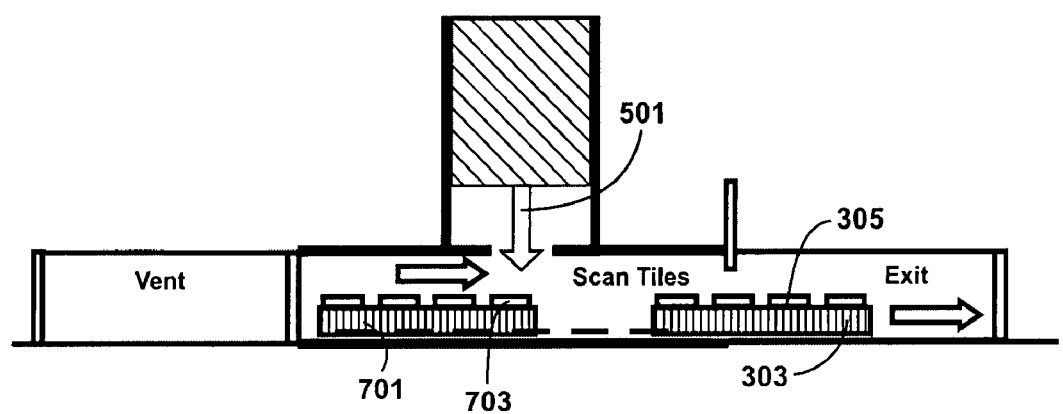
Figure 10:
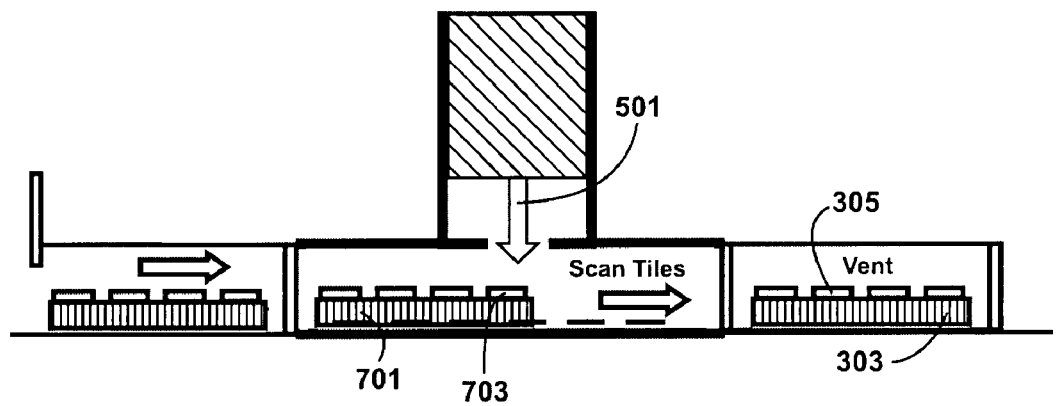

Also shown in FIG. 5, the first plurality of tiles is subjected to an implant process 501. The implant process uses a scanning process in a preferred embodiment. As shown, the scanning process is provided by the movable track member, that is, the moving track member is allowed to provide spatial movement while the implant device provides impurities to be implanted in a surface region of the first plurality of tiles. Concurrently, inlet 211 is closed and the inlet port is vented and brought to atmospheric pressure and a second substrate member 701 including a second plurality of tiles 703 is loaded into the inlet port as shown in FIG. 7. The second substrate member including the second plurality of tiles is maintained in a vacuum environment provided in the inlet port while awaiting the implant process on the first plurality of tiles to complete. As shown in FIG. 8-9, the second substrate member including the second plurality of tiles is transferred to the implant device. The first substrate member including the first plurality of tiles, upon completion of the implant process is transferred to a pumped down outlet port 217 by opening outlet door 221 as shown in FIGS. 9-10. While the second plurality of tiles are being implanted and outlet door 221 is closed, the outlet port can be brought to atmospheric pressure and the first substrate member including the first plurality of tiles can be removed from the outlet port and subjected to further processing. The method continues with other substrate members including plurality of tiles provided. Of course there can be other variations, modifications, and alternatives.

Figure 11:
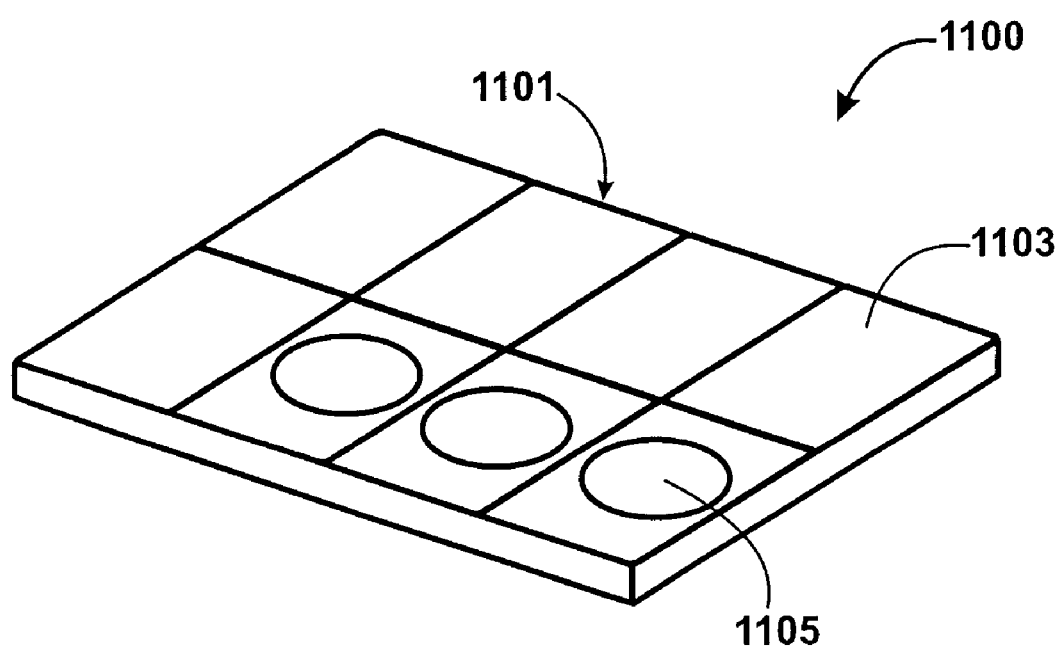
FIG. 11 is a simplified diagram illustrating a tray device for the continuous process for forming substrates according to an embodiment of the present invention.

Referring to FIG. 11, a tray device 1100 for performing one or more implant process using a continuous process according to an embodiment of the present invention is illustrated. The tray device can have a length of about one meter by one meter in a specific embodiment. As shown, the tray device includes a tray member 1103 housed in a frame member 1101. The frame member includes a plurality of sites 1105. Each of the plurality of sites includes a reusable substrate member 1107 to be implanted. The reusable substrate member may include a silicon bearing material, which can be a donor substrate in certain embodiments. Of course there can be other variations, modifications, and alternatives.

Figure 11A:
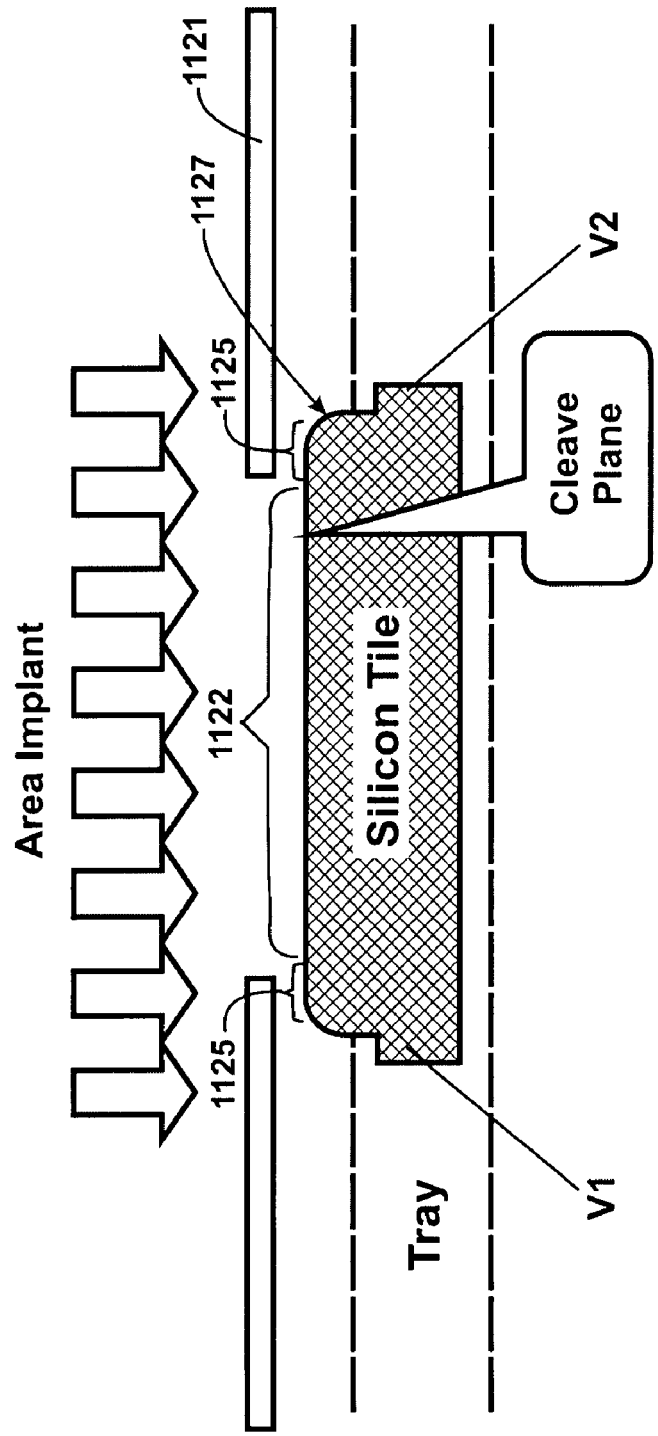
FIG. 11A is a simplified diagram illustrating an implant process according to an embodiment of the present invention.

FIG. 11A is a simplified diagram showing a tile being subjected to an implant process according to an embodiment of the present invention. The diagram is merely an example and should not unduly limit the claims herein. One of ordinary skill in the art would recognize other variations, modifications, and alternatives. As shown, a shadow mask 1121 is used to limit the implantation to a center region 1123 of the tile by masking a peripheral region 1125 near an edge of the substrate. As shown, a rounded edge 1127 is also provided for the tile. The combination of rounded edge 1127 provided for the tile and the shadow mask allows for a subsequent CMP/polish implant damage removal process to remove implant damage in all areas, including the edge areas. Having a build-up of implant doses in the edge areas would cause blistering, particulation, and other issues that can cause quality problems. The shadow mask can be an amorphous silicon coated frame that can be recoated or replaced periodically according to a specific embodiment of the present invention. The rounded edges can also help in the initiation and propagation of controlled-cleaving processes by allowing for insertion of a blade, a pin, or other mechanical means to impart a cleaving stress, if a fully thermal cleaving approach is not utilized.

In a specific embodiment, the plurality of sites are provided in an array configuration. As shown in FIG. 11, the plurality of sites may be configured as an eight by eight site array. The plurality of sites may be configured in a six by six site array. In a specific embodiment, the plurality of sites is configured to include three by three 300 mm wafers. In an alternative embodiment, the plurality of sites is configured to include five by five 200 mm wafers. In yet an alternative embodiment, the plurality of sites is configured to include six by six 150 mm wafers. Of course there can be other variations, modifications, and alternatives.

Figure 12:
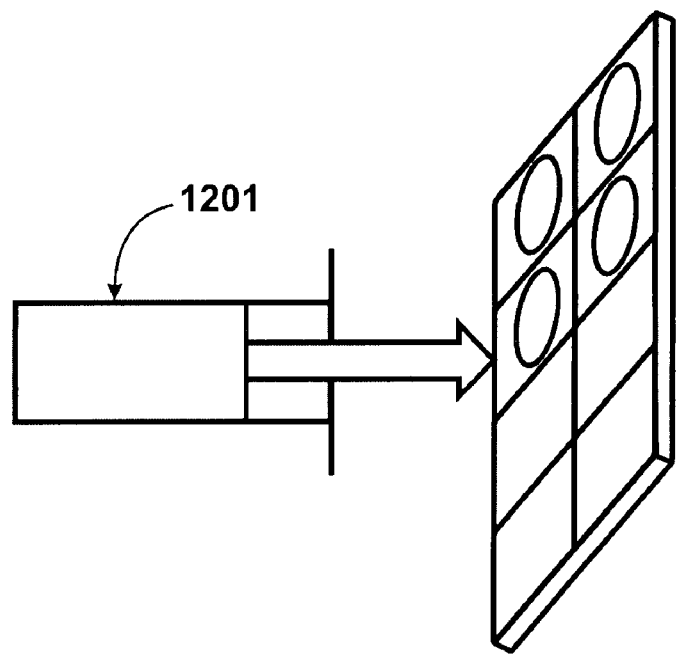
FIG. 12-14 are simplified diagrams illustrating a tray device for the continuous process for forming substrates according to an embodiment of the present invention.
Figure 13:
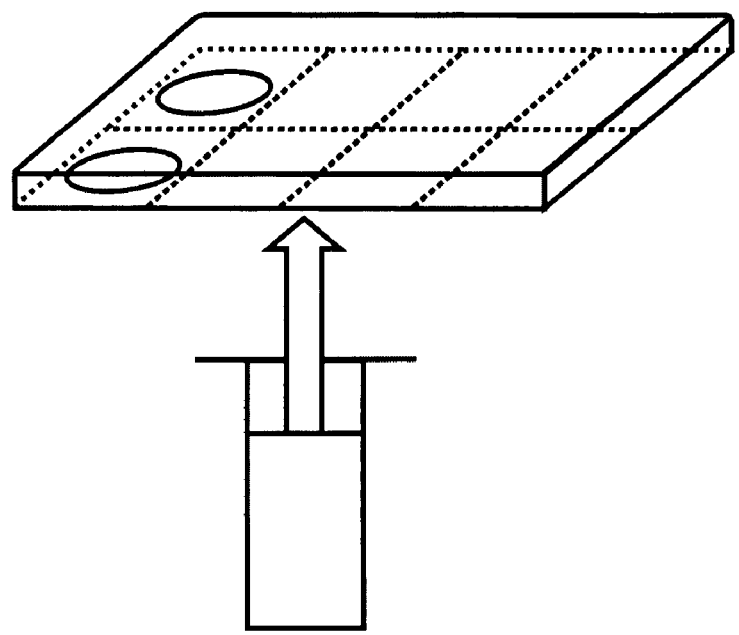
Figure 14:
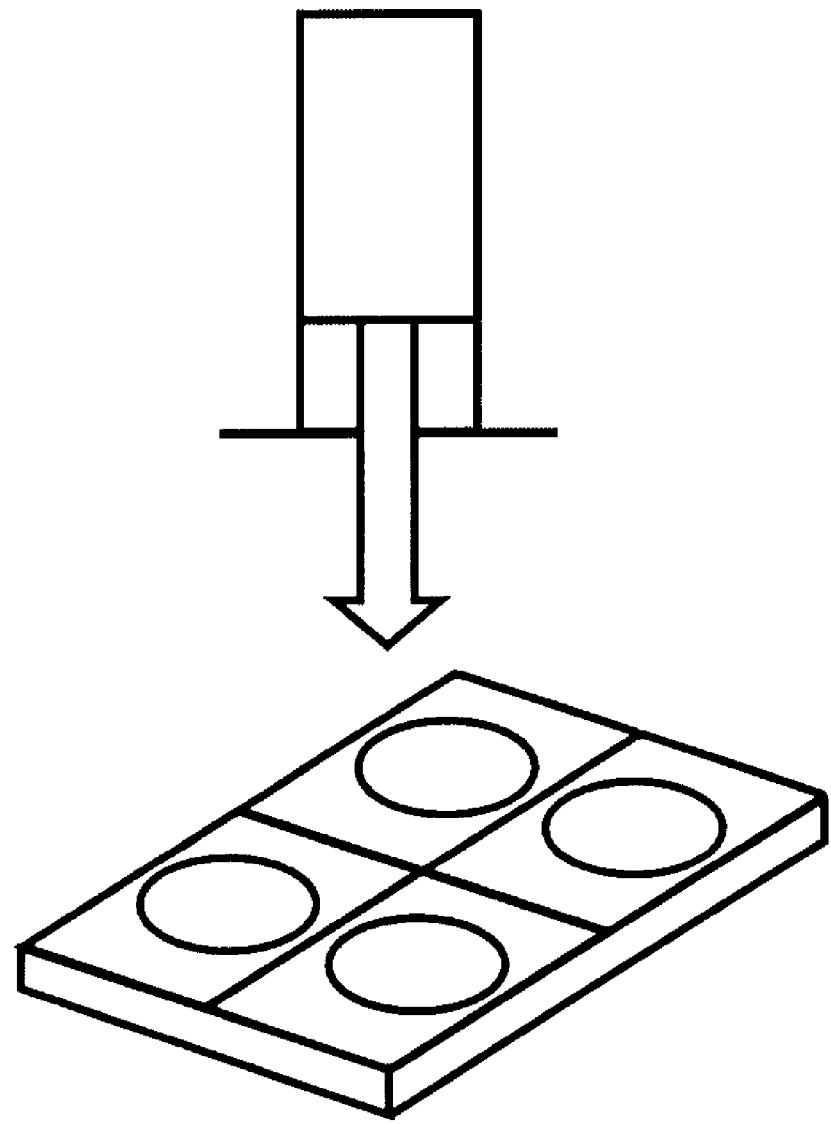

The tray device can be configured in a suitable orientation for the implant process to minimize defect (e.g., particles or other contaminants) formation on the tile surfaces. As shown in FIG. 12, such orientation includes a vertical orientation with respect to an implant shower head 1201. Such orientation may also include an upside-down orientation as shown in FIG. 13, or an angled orientation as shown in FIG. 14. Of course the number of substrates and orientation of the tray device depend on the application, and the possible need to control such effects as channeling of the implant species within the substrate. One skilled in the art would recognize many variations, modifications, and alternatives.

Figure 15:
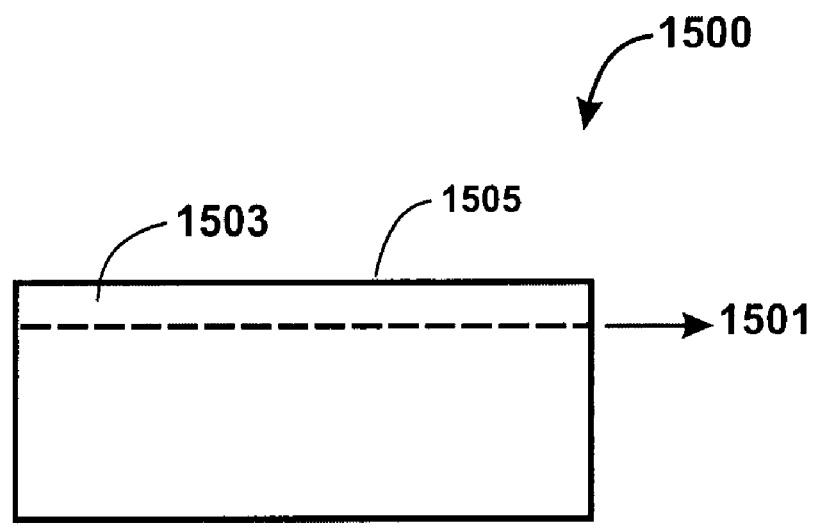
FIG. 15-19 illustrate a method of forming a layer transferred substrate according to an embodiment of the present invention.

Effectively, the implant process introduces certain energetic particles through a top surface 1505 of a donor substrate 1500 to a certain depth 1501, which defines a thickness of semiconductor material 1503 from the surface as shown in FIG. 15. Depending on the application, small mass particles are generally selected to reduce a possibility of damage to the material region according to a preferred embodiment. That is, small mass particles travel easily a substrate member without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into a silicon wafer as an example, the implant process may be provided using an ion shower system having an ion shower head width of about 450 mm using the scanning process. The implantation process is performed using a specific set of conditions. For shallower implant applications such as for the use of the transferred film as an epitaxial thickening template, for example, ion current density as provided by $H^{3+}$ can be 20 micro-amps per $cm^2$ or $1.25 \times 10^{14}$ $H^{3+}$ ions per $cm^2$ per second or $3.75 \times 10^{14}$ $H^+$ ions per $cm^2$ per second. For an implantation dose of about $2 \times 10^{16}$ hydrogen atoms per $cm^2$ in the silicon wafer, a scan time for any surface region through the 450 mm width may take approximately 53 seconds. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer. The hydrogen ions can be selectively introduced into the silicon wafer to the selected depth at an accuracy of about ±0.03 to ±0.05 microns. Heating the silicon wafer concurrently with the implantation process may provide certain advantage. One such advantage includes optimizing a subsequent layer transfer process. The silicon wafer may be heated by conduction heating using a hot plate built within the frame assembly. In a specific embodiment, the tiles may be heated using a resistive heating process utilizing the electric resistive nature of the tiles by passing a suitable electric current the through the tiles using two opposite contacts. Of course, the type of ion used and process conditions depend upon the application.

In a specific embodiment, using higher implant energies, it is particularly useful to have a relatively pure proton implantation (positive or negatively charged) to allow the maximum range of the cleaving plane within the reusable substrate. For example and using silicon, the range of implantation can be quite large and span from a few keV for template formation photovoltaic absorber where a subsequent epitaxial growth is needed to maximize absorber efficiency to many MeV yielding substrates measuring hundreds of micron in thickness for use as a solar cell wafer starting material. The general ranges are calculated using for example SRIM 2003 (Stopping Range In Matter), a Monte Carlo simulation program (http://www.srim.org/). Further details of providing silicon film thickness ranges that can be achieved by proton implantation are described below.

In a specific embodiment, silicon film thickness ranges from about 13 nm to about 3 um can be achieved by using a proton implant energy ranges from about 10 keV to about 300 keV. The above range allows the efficient transfer of a crystalline epitaxial material that can be used as a homoepitaxial or heteroepitaxial growth template for solar cell formation. Of course, there can be other variations, modifications, and alternatives.

In a specific embodiment, silicon film thickness ranges from about 1 um to about 50 um can be achieved by using a proton implant energy ranges from about 120 keV to about 2.1 MeV. The silicon film in this thickness range can be detached to provide a thickness of a single-crystal silicon film of sufficient thickness to form a thin-film solar cell directly with good efficiency. That is, the thickness range of single crystal silicon formed does not need to be further thickened to be used as an efficient light absorber layer in solar cell application. Techniques to maximize thin-film silicon solar cell efficiencies such as front/back contact formation, use of two-sided access manufacturing and light scattering layers to trap more light within the thin-film light absorber layer have been well developed and can be used in combination with this detached layer. Such techniques are well covered, for example, by "Thin-Film Crystalline Silicon Solar Cells—Physics and Technology" by Rolf Brendel (2003 Wiley-VCH Verlag GmbH & Co., KGaA, Weinheim), which is incorporated by reference herein. Of course, there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrate in the thickness range of 50 um to 200 um may be used to replace present method of using wafer sawing, etching and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements.

Energies higher than 5 MeV may be used to make semiconductor processing alternative substrate materials, but in solar cell manufacturing, 200 um is desired for silicon solar cell material thickness for bulk silicon solar cell formation. As a result, thicker silicon substrates are not of particular commercial interest for fabricating solar cell according to a specific embodiment. Of course, the type of ion used and process conditions depend upon the application.

Figure 23:
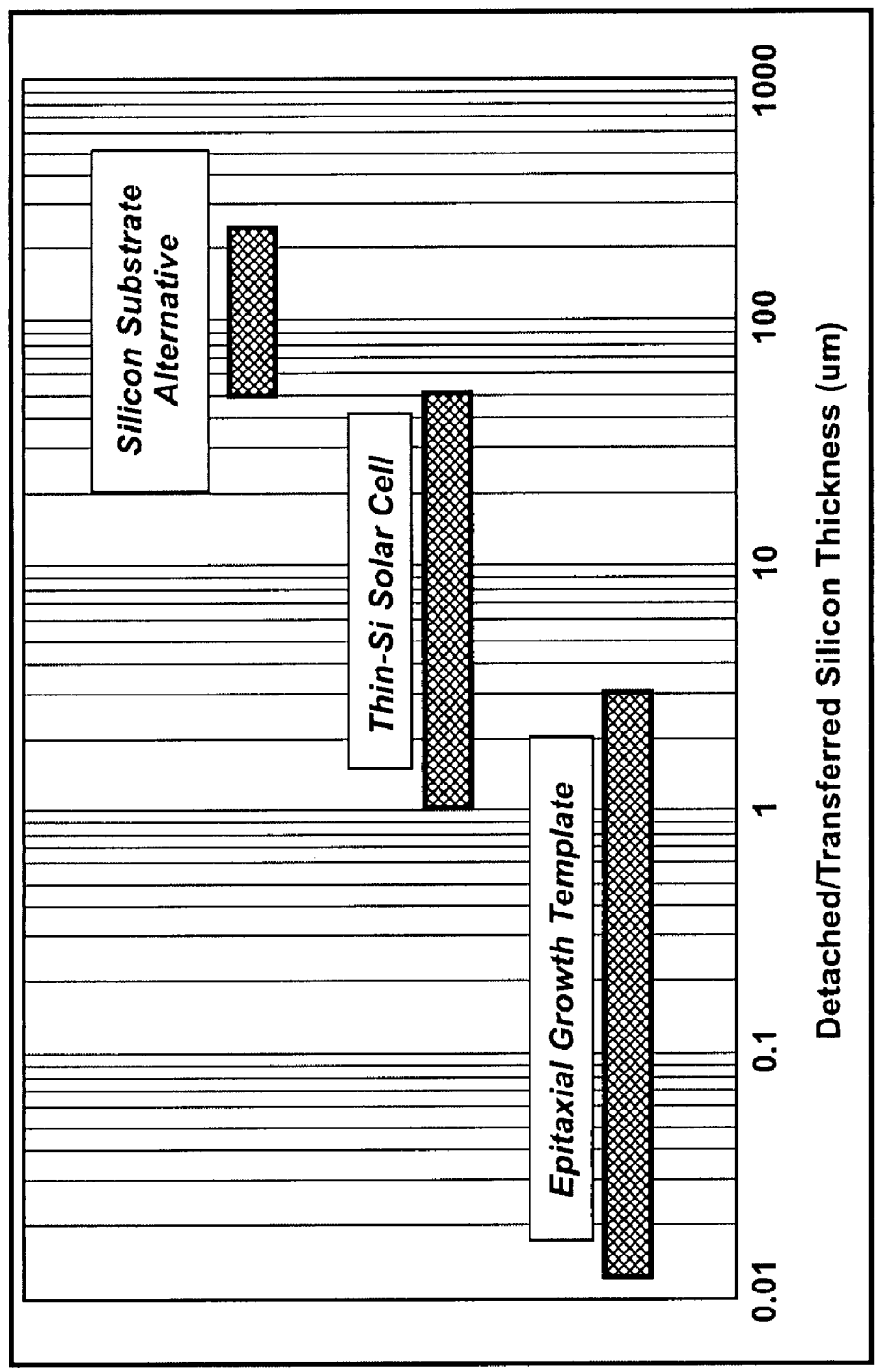
FIG. 23 is a simplified diagram illustrating the range silicon thickness and the classes of silicon solar cell applications according to an embodiment of the present invention.

The range of silicon thicknesses and the classes of silicon solar cell absorber application is shown in FIG. 23 for proton implantation. The MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983). In this disclosure, the use of up to 7 meV proton implantation with optional implant and post-implant reusable substrate heating was disclosed to yield detached silicon wafer thicknesses up to 350 um. The term detached or transferred silicon thickness in this context means that the silicon film thickness formed by the implanted ion range can be released to a free standing state or released to a permanent substrate or a temporary substrate for eventual use as a free standing substrate or eventually mounted onto a permanent substrate. Of course, the particular process for handling and processing of the film will depend on the specific cell process and application.

Figure 24:
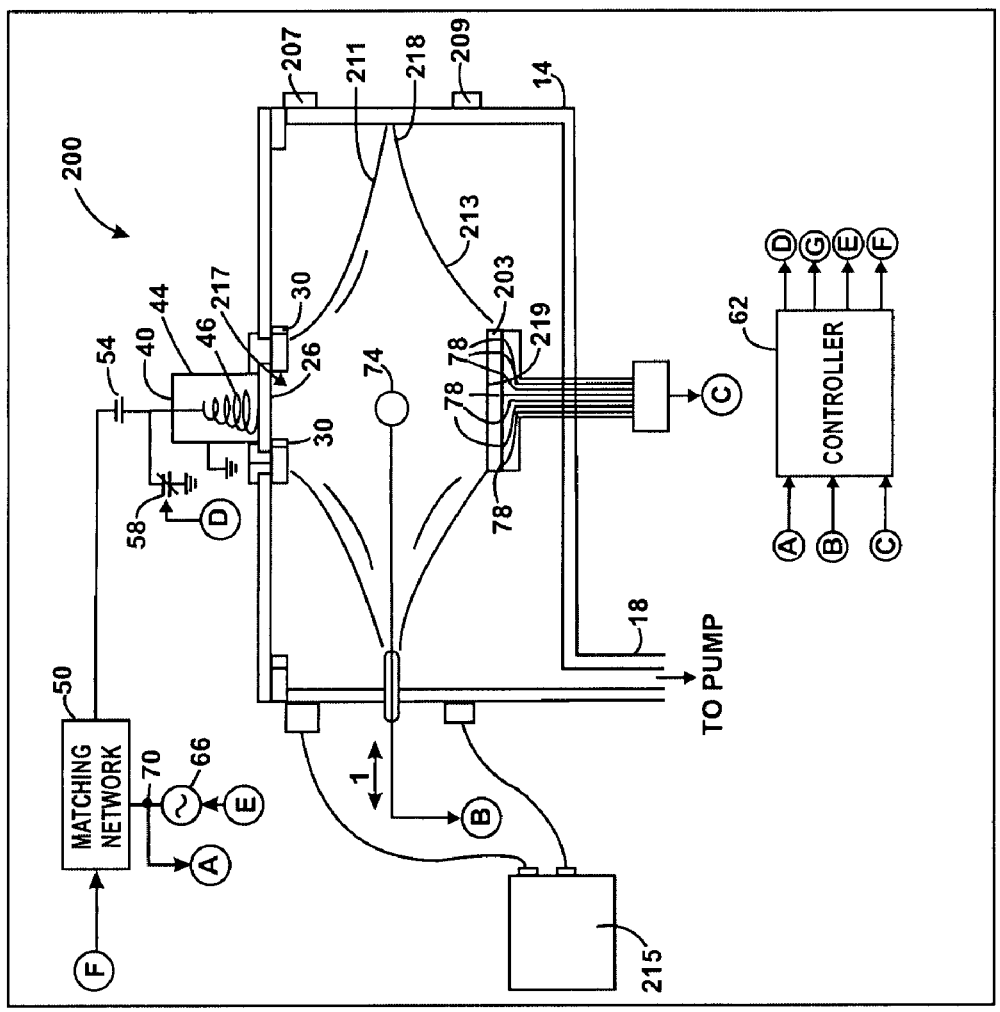
FIG. 24 is a simplified diagram showing the protonic mode high-density plasma source as an example of a source that can be used to form thick crystalline material films according to an embodiment of the present invention.
Figure 24A:
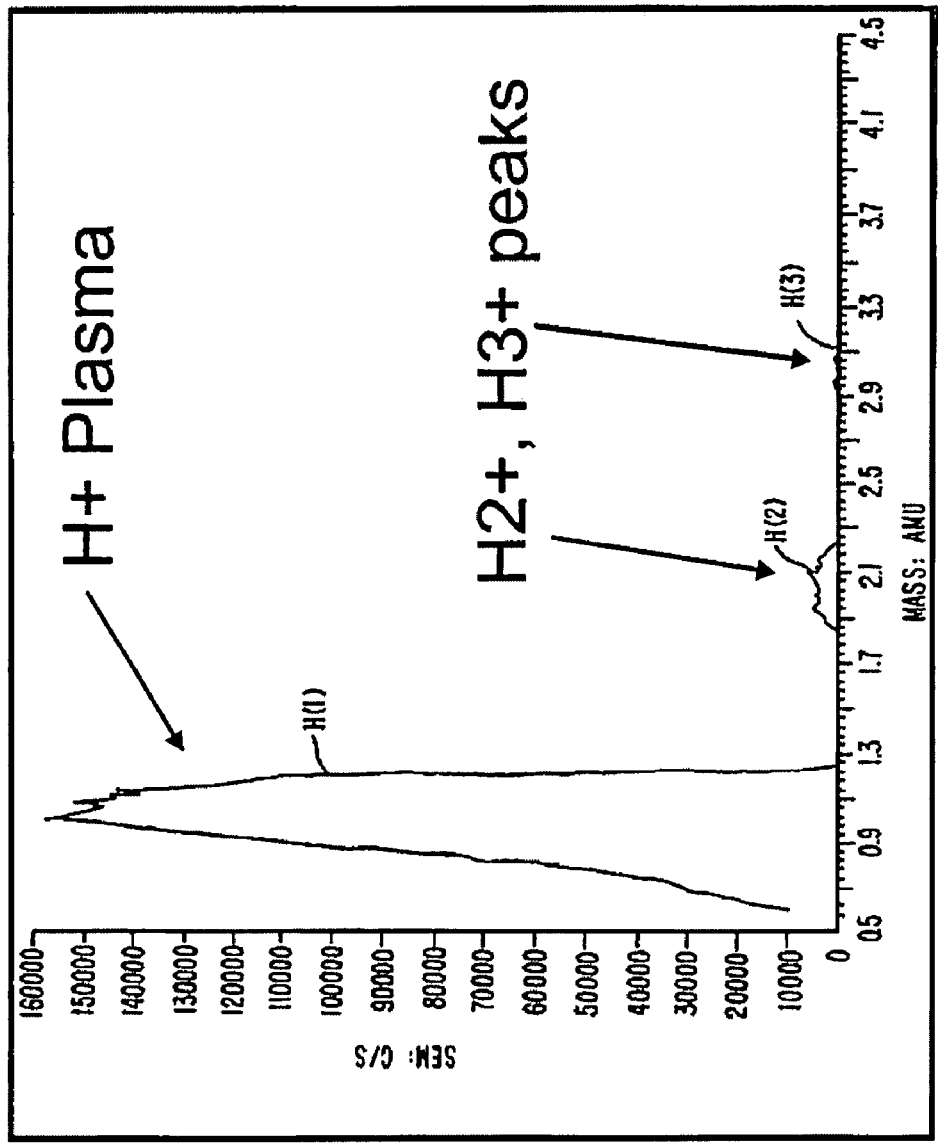
FIG. 24A shows mass spectrometery of the plasma chemistry showing high H+ content.
Figure 25:
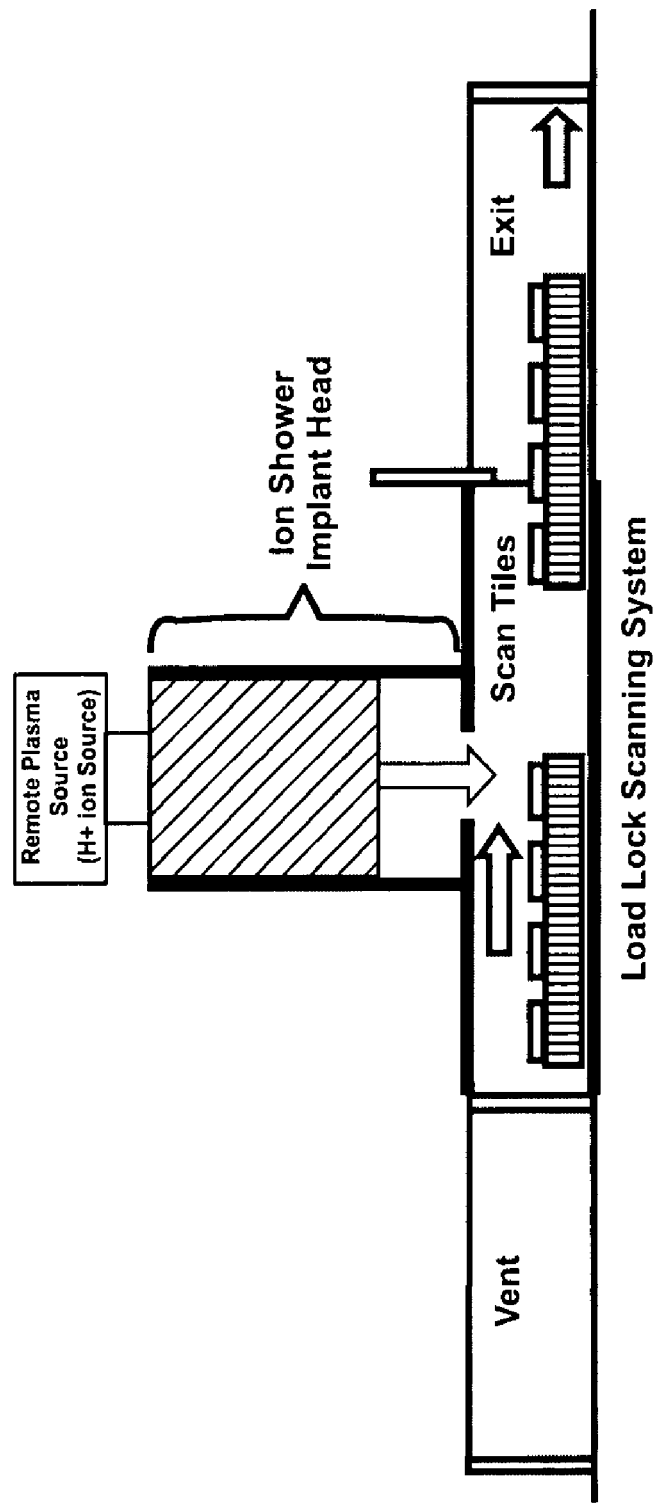
FIG. 25 is a simplified diagram illustrating an example of a remote plasma source integrated into an ion shower continuous process system for forming substrates according to an embodiment of the present invention.

In a specific embodiment, the use of proton implantation within a mass or non-mass separated system would benefit from a high density proton ion source. One such source was developed at Silicon Genesis Corporation using an inductively-coupled plasma (ICP) excited plasma with a cusp magnetic confinement. The technology is described in U.S. Pat. No. 6,300,227, incorporated by reference herein for all purposes and commonly assigned to Silicon Genesis Corporation, San Jose, Calif. The plasma mode called the Protonic Mode efficiently cracks higher-order hydrogen plasma species (H2+, H3+) to generate a highly pure H+ plasma chemistry with a plasma density usually exceeding 1e10 H+ ions/cm3. FIGS. 24-24A shows 2 representative figures from U.S. Pat. No. 6,300,227, a mass spectrometer of the plasma chemistry showing the high H+ content and a cross section of the plasma source in a plasma-immersion ion implantation embodiment. This source can be advantageously used as a remote plasma source within an ion shower system to inject H+ ions for acceleration and implantation to a target substrate or a multiplicity of substrates. The remote plasma source can be used within an existing ion shower implant head such as the ISDR ion doping system built by Ishikawajima-Heavy Industries (IHI) of Tokyo, Japan or other ion shower systems. In the IHI system for example, a hot filament plasma excitation can only crack hydrogen to a predominantly H3+ plasma chemistry. Although this may offer ion dose rate advantages for the lower energy application (i.e. the epitaxial growth template thin-film regime) due to the triple effective proton dose rate per implantation current afforded by the H3+ ion, the penetration range is significantly shallower since the effective proton energy is ⅓ of the H3+ implant energy. For the deeper applications, this would necessitate a 3 time increase in implant energy. Although this can be possible, high-voltage equipment expense rises super-linearly with accelerating potential. The use of a high-density H+ ion source would be advantageous to limit the maximum required energies to less than 5 MeV. FIG. 25 shows the remote plasma source such as the protonic mode injecting H+ ions into an ion shower head for H+ implantation according to a preferred embodiment of this invention. Alternatively, a microwave source or other source that can yield the appropriate plasma chemistry can also be used. In another embodiment, a different plasma source yielding a predominantly H2+ or H3+ plasma chemistry may also be used to improve ion dose rate if the ion range is still within the implant energy range of the particular ion shower system. Of course, the particular plasma chemistry and accelerating potential used will depend on the specific application.

Reutov et al. also disclosed that a reduction of the proton dose necessary for detachment is possible with the heating of the reusable substrate (an ingot in the specific disclosure) to an appropriate temperature that can more efficiently use the implanted protons. In the described embodiments, the room-temperature dose necessary to fully detach a 350 um silicon wafer was reduced from 5e17 protons/cm2 to 5e15 protons/cm2 by subjecting the ingot to an implant temperature of 750K and a post-implant anneal of 850K for about 40 minutes. The effective dose reduction of 100 times reported can have a substantial impact in the productivity and of this process for thicker films. Combination of implant and post-implant heat treatments can thus be used in conjunction with the implanted dose and energy in developing a cost-effective commercial process.

The use of a large-area implanter utilizing plasma-immersion ion implant or ion shower technologies, especially non-mass selected implanters may co-implant contaminants through the silicon surface. For example, the implantation of iron can substantially lower the effective minority carrier lifetime of the resulting silicon absorber layer and thus cause an undesirable lowering of the cell conversion efficiency. Due to the larger implantation range of hydrogen, a screening layer can be utilized to keep iron from entering into the crystalline silicon film. The necessary thickness of the screening layer would depend on the implant energy, the contaminant being screened, and the screen material. Using silicon dioxide as the screening layer and iron as the contaminant, a 300 keV implant would require about 0.3 um of silicon dioxide thickness to completely stop the iron while a 5 MeV substrate application would require a 3.5 um to 4 um thick silicon dioxide layer. This layer can be removed by a chemical strip such as an HF strip or a polishing step or kept throughout the cell manufacturing process.

The productivity and technical feasibility of a higher energy implant system can be estimated with the following example. The example is of an ion shower having a total beam current density limited by a 100 kW total power of the system delivered onto the reusable substrate area being implanted. In this way, the beam current density is scaled to the implant energy to limit the power delivered onto the reusable substrate surface to a constant power flux as higher power flux densities can damage the silicon to make it unusable for its intended purpose as a solar cell material. An implant area of 1 meter by 0.45 meter is assumed, close to the ion shower head dimension of a Generation 4 flat-panel display ion doping system. If the reusable substrate size is 150 mm square, about 18 substrates, each with 225 cm2 area can be simultaneously implanted. The power density is thus 100 kW divided by the total substrate area being implanted or 18×225 cm2 or 24.6 watts/cm2. This is well within a safe power density range for silicon and no damage to the implanted silicon substrates will occur. Using 6e16 cm−2 as the dose in the low-energy template regime and 5e15 cm−2 as the dose in the higher energy regimes, a reasonable substrate implant processing rate of over 3000 substrates per hour is produced at 3000 Angstroms thickness, 850 substrates per hour at 50 um thickness and over 600 substrates at 100 um thickness. The importance of the dose reduction available for detaching thick films in combination with implant and post-implant anneals is readily appreciated in this example.

Figure 26:
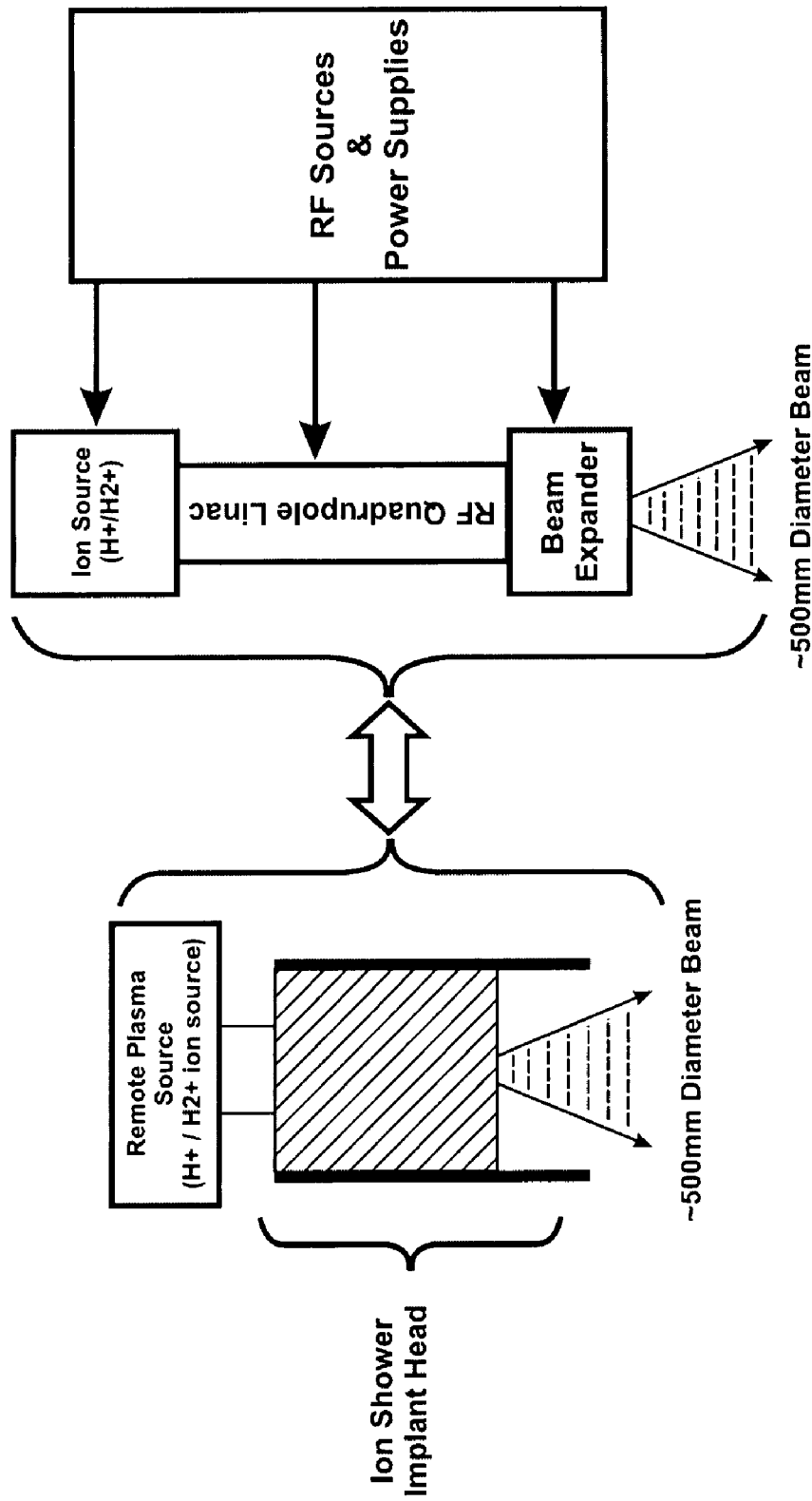
FIG. 26 is a simplified diagram illustrating a mass selected RFQ-Linac implant shower head according to an embodiment of the present invention.

In another specific embodiment, a mass-selected high-energy implant approach can also be of substantial use. In a specific embodiment, the mass selected high energy implant is provided if it can be made with the appropriate beam intensity. To be cost-effective, the implant beam current can be on the order of a few tens of milliamps of H+ or H− ion beam current (if the system can implant higher energies efficiently, H2+ ions can be advantageously utilized for achieving higher dose rates). Such mass-selected implantation apparatus are available by the use of Radio-Frequency Quadrupole LINear ACcelerator (RFQ-Linac) or Drift-Tube Linac (DTL) technology according to a specific embodiment. These apparatus are generally available from companies such as Accsys Technology Inc. of Pleasanton, Calif., but can be others. These approaches uses RF acceleration of an extracted proton beam to increase the total energy of the proton beam from a range of approximately 20-100 keV to 0.5 to 7 MeV or more according to a specific embodiment. That is, the output beam is usually on the order of a few millimeters in diameter and for use in this application would often require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. FIG. 26 shows an RFQ-Linac mass-selected ion shower source. Of course, there can be other variations, modifications, and alternatives.

As a specific example, assuming 100 kW of proton beam power, a 3.25 MeV RFQ-Linac would yield a proton beam current of about 31 mA. Using a dose of approximately 1e16 H/cm2 and an expanded beam of about 500 mm×500 mm, the processed area per hour is about 7 square meters while the power flux is kept to about 13 Watts/cm2 according to a specific embodiment. This combination of parameters makes this approach particularly practical for cost effective solar cell production. Again, there can be other variations, modifications, and alternatives. Implantation of substrates at high energies utilizing linear accelerator technology is discussed in U.S. Provisional Patent Application No. 60/886,912 filed Jan. 26, 2007, and U.S. Provisional Patent Application No. 60/864,966 filed Nov. 8, 2006, each of which is co-assigned with the present invention and incorporated by reference in its entirety herein for all purposes.

The implanted particles can add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Figure 16:
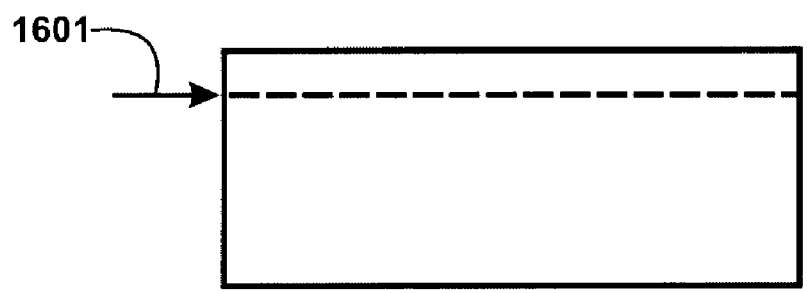

Accordingly, after implantation, each of the donor substrate is subjected to a cleaving process using energy 1601 provided in a selected portion of a cleave plane 1603 as shown in FIG. 16. Depending on the specific embodiment, there can be other variations. For example, the cleaving process can be a controlled cleaving process using a propagating cleave front to selectively free the thickness of material. Alternative cleaving techniques may also be used. These techniques include but not limited to those called a Nanocleave™ process of Silicon Genesis Corporation of San Jose, Calif., a Smart-Cut™ process of Soitec SA of France, and an Eltran™ process of Canon Inc. of Tokyo, Japan, any like processes, and others. The method then removes remaining portion of the donor substrate which may also be used as another donor substrate according to a preferred embodiment.

The method of detaching the film is a function of the thickness of the film and its ability to be handled or processed without being attached to a mechanical substrate. For the very thin-films used for epitaxial template growth for example, the transfer of the film onto a temporary of permanent substrate is necessary to avoid damaging the film. For material film thicknesses exceeding about 50 um, the films may be handled in a free standing manner to be used in the manufacture of solar cells. The use of a temporary substrate for films of 3-50 um for crystalline solar cell applications would be useful to access and process both sides of the detached thin-film to optimize the resulting photovoltaic device. Permanent bonding and transfer of the thin-film onto a permanent substrate may also have benefit in simplifying the film handling process. Of course, the exact choice of the transfer substrate and cell manufacturing process flow depends on the application.

Figure 17:
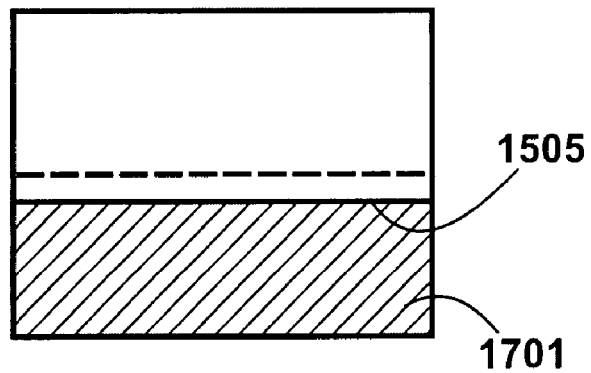

In a specific embodiment, each of the donor substrates including the thickness of material may be attached or bonded to a handle substrate 1701 to form a bonded substrate structure. In a specific embodiment, the handle substrate can be a silicon wafer. In an alternative embodiment, the handle substrate can be a transparent substrate such as quartz or glass. Of course the handle substrate used depends on the application. As shown in FIG. 17, the handle substrate is bonded to the surface region of the donor substrate. The substrates may be bonded using an EVG bonding tool manufactured by Electronic vision group or other like process for smaller substrate sizes such as 200 mm or 300 mm diameter wafers. Other types of tools such as those manufactured by Karl Suss may also be used. Of course, there can be other variations, modifications, and alternative.

Accordingly after bonding, the bonded substrate structure can be subjected to a thermal treatment according to a specific embodiment. The thermal treatment may be a bake treatment using heating elements such as a thermal plate coupled to the handle substrate in a specific embodiment. In an alternative embodiment, the thermal treatment may be a bake treatment using heating elements such as a thermal plate coupled to the donor substrate. The thermal treatment provides a temperature gradient through a portion of a thickness of the donor substrate and a portion of the handle substrate. Additionally, the thermal treatment maintains the bonded substrate structures at a predetermined temperature and for a predetermined time. Preferably, the temperature ranges from about 200 or 250 Degrees Celsius to about 400 Degrees Celsius and is preferably about 350 Degrees Celsius for about one hour or so for a silicon donor substrate and the handle substrate to attach to each other permanently according to the preferred embodiment. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process.

Alternatively, a variety of other low temperature techniques can be used to join the donor substrate surface regions to the handle substrate. For instance, an electro-static or an anodic bonding technique can be used to join the two substrates together. In particular, one or both substrate surface(s) is charged to attract to the other substrate surface. Additionally, the donor substrate surface can be fused to the handle substrate using a variety of other commonly known techniques. Of course, the technique used depends upon the application.

Figure 18:
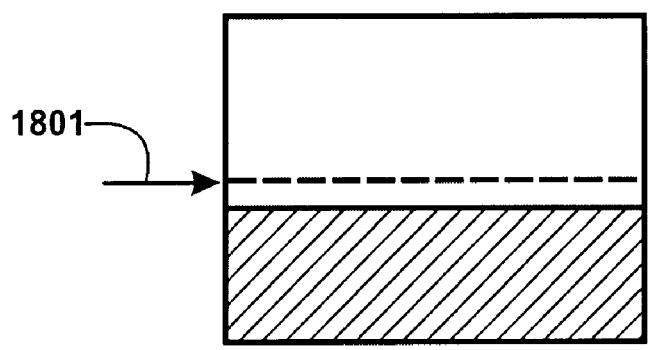
Figure 19:
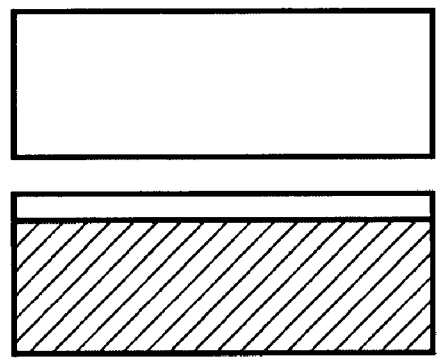

Referring to FIG. 18, the method includes initiating a cleaving process using energy 1801 provided in a selected portion of the cleave plane to detach the thickness of semiconductor material from the donor substrate, while the thickness of material remains joined to the handle substrate. Depending on the specific embodiment, there can be certain other variations. For example, the cleaving process can be a controlled cleaving process using a propagating cleave front to selectively free the thickness of material from the donor while the thickness of material remained joined to the handle substrate. Alternative cleaving techniques can also be used. Such techniques include but not limited to those called a Nanocleave™ process of Silicon Genesis Corporation of San Jose, Calif., a SmartCut™ process of Soitec SA of France, and an Eltran™ process of Canon Inc. of Tokyo, Japan, any like processes, and others. The method then removes remaining portion of the donor substrate, which has provided the thickness of material to the handle substrate according to a specific embodiment. The remaining portion of the donor substrate may be reused as another donor substrate according to a preferred embodiment. Of course there can be other variations, modifications, and alternatives.

In a specific embodiment, devices such as photovoltaic devices may be formed in the thickness of material. Such application is described more fully in another application, "Method and Structure for Fabricating Solar Cells Using a Layer Transfer Process," commonly assigned, in the name of Henley, Francois J. and is listed as U.S. Provisional Ser. No. 60/783,586 filed Mar. 17, 2006, which is hereby incorporated by reference in its entirety. Of course, there can be other variations, modifications, and alternatives.

Again, using implanting $H^{3+}$ ion as an impurity into a single crystal silicon as an example. Implant energy is provided at 100 keV. The thickness of silicon material may have a thickness of about 250 nm. A thickening process may be needed to thicken the silicon material to enhance efficiency of solar cells fabricated thereon. The thickening process may be a direct epitaxial process using a high temperature or a low temperature growth process. The thickening process may also include an amorphous silicon or a polysilicon deposited on the thickness of silicon material followed by a liquid phase or a solid phase epitaxial regrowth process. Alternatively, a higher energy implant process may be used to allow for a transfer of a sufficiently thick absorber layer. To form a cleave plane using hydrogen and/or helium implant, an implant energy of about 500 keV or higher may be used. Of course there can be other variations, modifications, and alternatives.

Effectively, the implant process introduces certain energetic particles through a top surface of a semiconductor substrate to a certain depth, which defines an impurity region in a thickness of semiconductor material from the surface. Take silicon substrate as an example. Silicon substrates are often provided having a certain impurity, e.g., P-type. The P type impurity may be provided at a boron concentration of about 1E16-1E20 atoms cm−3 to provide a resistivity of 0.005-50 ohm-cm. For such wafers, P type impurities can be implanted to formed a heavily doped P+ region in a region vicinity to the surface of the substrate in a specific embodiment. In certain embodiment, the boron particles can be derived from precursors such as BF3 or BC13 among others. Depending on the application, the boron species are usually provided with a predetermined kinetic energy to penetrate a selected depth of the silicon substrate. Of course there can be other variations, modifications, and alternatives.

Using BF3 as the implanted species into a silicon wafer as an example, the implant process may be provided using an ion shower system having an ion shower head width of about 450 mm using the scanning process. Boron can be provided at an energy of about 100 keV at a dose of about $5 \times 10^{14}$ ions per cm2 to provide for a boron concentration of about 1020 atoms per cm3 to a depth of about 400 nm to about 500 nm in silicon. For the implantation dose of about $5 \times 10^{14}$ boron atoms per cm2 in the silicon wafer, a scan time for any surface region through the 450 mm width may take approximately 55 seconds. Implantation temperature ranges from about −20 to about 600 Degrees Celsius, and is preferably less than about 400 Degrees Celsius to prevent a possibility of a substantial quantity of dopant ions from diffusing out of the implanted silicon wafer. The boron ions can be selectively introduced into the silicon wafer to the selected depth at an accuracy of about ±0.05 to ±0.15 microns. After implantation, the silicon wafer is usually subjected to an anneal process to distribute and to electrically activate the dopant particles in the substrate. Of course, the type of ion used and process conditions depend upon the application.

Depending on the applications, there can be variations, for example, a N type impurity may be implanted in a thickness s in a vicinity of the surface of a P-type semiconductor substrate. The impurity particles are provided in a predetermined depth in a specific embodiment. Such N type impurity may include phosphorus, arsenic, antimony, or other suitable elements. Take phosphorus as an implant species as an example. Phosphorus species may be provided using at least PH3 as a precursor. Implant energy can be provided at tens of keV to a few MeV. For example, implant can be provided by P+ at about 100 keV at a dose of about $1 \times 10^{14}$ atoms/cm2 to provide an average implant depth of about 150 nm and a concentration of about 1019 atoms/cm3. The implantation usually causes a certain amount of crystal dislocation and other micro-defects in the substrate. Such defects may be at least partially repaired using a subsequent thermal treatment, e.g., thermal annealing, rapid thermal annealing. In a specific embodiment, the N type impurity provides at least one pn junction in a thickness of a P type semiconductor substrate. The at least one pn junctions may be used to fabricate devices, for example a solar cell device in certain embodiment. Of course there can be other variations, modifications, and alternatives.

Figure 20:
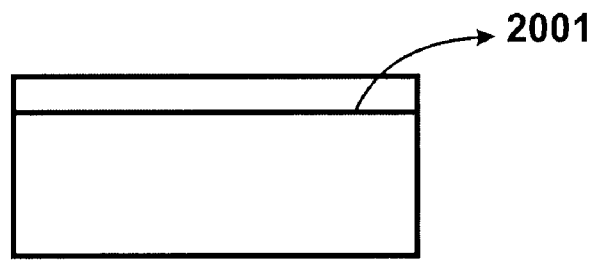
FIGS. 20-22 illustrate a method of forming a solar cell structure according to an embodiment of the present invention.
Figure 21:
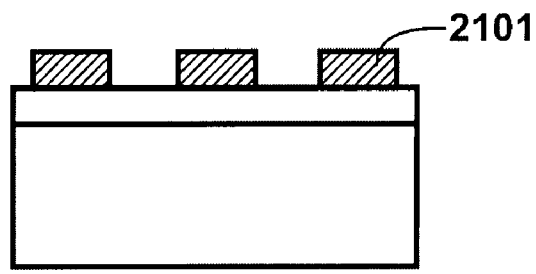
Figure 22:
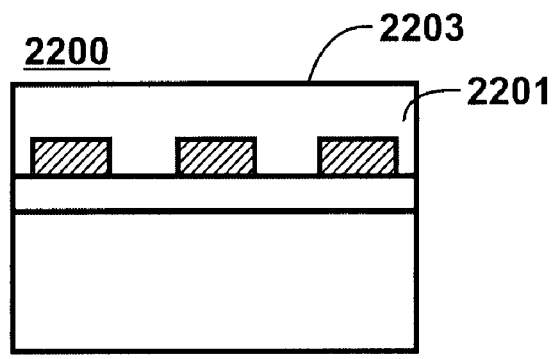

FIGS. 20-22 are simplified diagrams illustrating a method of fabricating solar cells according to an embodiment of the present invention. As shown in FIG. 20, impurities implanted in a semiconductor substrate provide a p-n junction 2001 or multiple p-n junctions in a thickness near the surface of the semiconductor substrate. In a preferred embodiment, devices such as photovoltaic cell structures may be formed in the thickness of semiconductor substrate using the p-n junction or multiple p-n junctions. Of course there can be other variations, modifications, and alternatives.

As shown in FIG. 21 the method forms a contact layer 2101 overlying the surface region of the semiconductor substrate including the p-n junctions in the thickness of material which has at least one photovoltaic cell structure formed therein. The contact layer can be made of a suitable optically transparent conductive material such as ITO and the like. Other materials may also be used. In a preferred embodiment, the contact layer is patterned to form a plurality of electrodes which couples to each of the photovoltaic cells. If the photovoltaic cell is to be illuminated from the opposite side, the contact can be opaque to transmission and preferably highly reflective to help maximize light collection efficiency by allowing a return path through the cell. Texturing the surface to further optimize efficiency is also well known by converting the light from specular to Lambertian within the cell to cause multiple internal reflections with better overall light absorption and conversion. Of course there can be other variations, modifications, and alternatives.

In a specific embodiment, the method also forms a planarized dielectric layer 2201 having a surface region 2203 overlying the patterned contact layer including the at least one photovoltaic cells as shown in FIG. 22. The dielectric layer may include material such as silicon dioxide deposited using a CVD process and the like. In a specific embodiment, the dielectric material is substantially optically transparent to allow electromagnetic radiation to traverse through the dielectric layer or layers. A simplified photovoltaic cell structure 2200 is shown in FIG. 22. Thereafter, the photovoltaic cell structure can be further processed and assembled into solar cell modules and solar cell assembly according to a specific embodiment. Of course there can be other variations, modifications, and alternatives.

Figure 27:
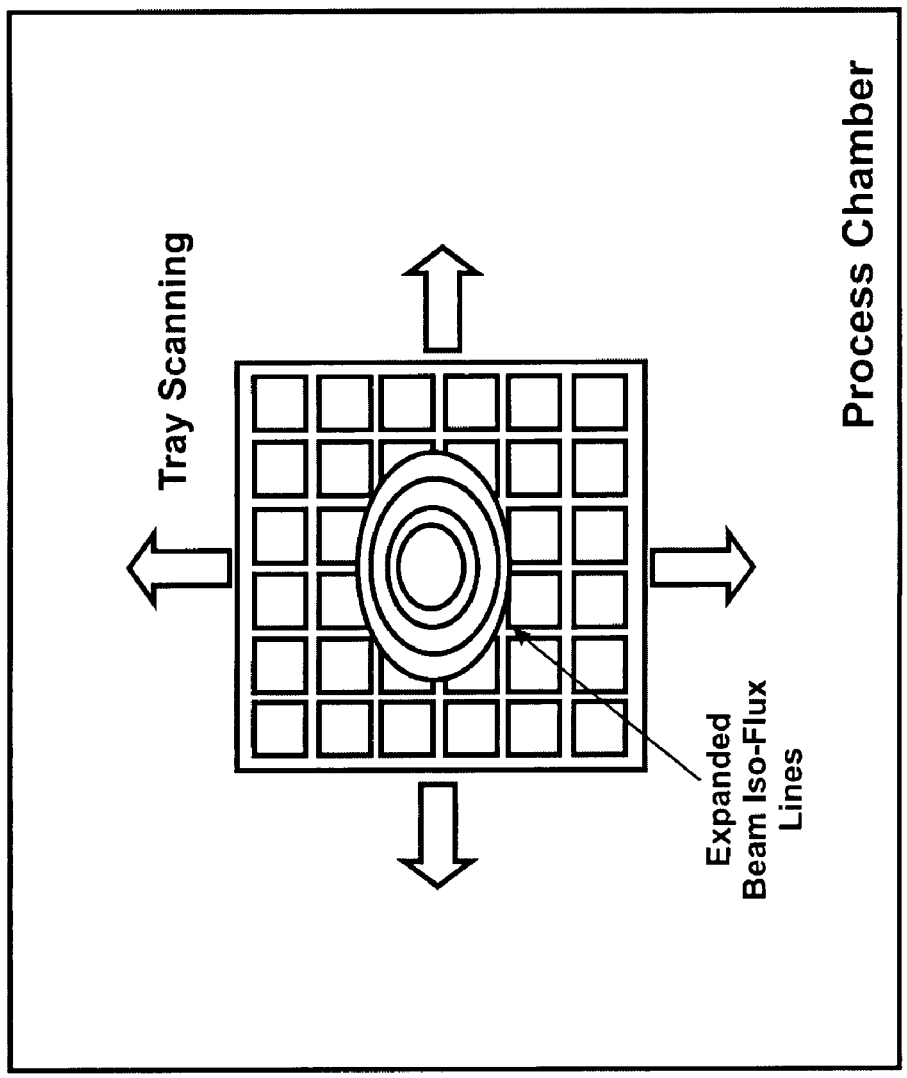
FIG. 27 is a simplified diagram of a continuous process for forming substrates with transverse and longitudinal scanning according to an embodiment of the present invention.

Another embodiment of the invention is described by way of the following example. A use of a RFQ-Linac is utilized where after a beam expansion, this source develops a 500 mm×500 mm stationary ion beam (this can also be termed a mass-selected ion shower head or other term that is suitable and understood by one of ordinary skill in the art). In a specific embodiment for mass-production of multiple tiles arranged in a tray of roughly 1 meter by 1 meter, the beam is not sufficient to scan the width of the tray of tiles and therefore a longitudinal and transverse scanning process is undertaken within the process chamber. FIG. 26 shows an RFQ-Linac mass-selected ion shower source according to one embodiment of this invention. The ion beam is expanded but includes an X-Y scanning of the implant area if the area exceeds the expanded ion beam dimensions. As an example, an advantage of beam scanning is to eliminate beam flux and spatial energy non-uniformities through ion flux averaging by integrating the total dose where each point of the target surface is equally scanned over the ion shower beam. FIG. 27 shows the concept of implant dose normalization through X-Y scanning over the ion shower beam impinging within the implant process chamber onto a 6×6 array of silicon tiles arranged within a tray. Beam flux averaging would allow the cleave process to be more predictable and uniform in its ability to use the same process conditions to initiate and propagate a cleave process across all tiles and within each tile. Spatial energy averaging would be advantageous to help achieve a highly uniform average detachment thickness across all tiles and within each tile by scanning all parts of the beam which may have slight differences in beam entry angles or energy that would generate, absent any averaging, a steadily worsening tile surface planarity. This would necessitate more frequent polishing or lapping of the tiles to recover a planar surface. Of course, predictable dose non-uniformities for achieving a patterned implant controlled-cleave process can be introduced using a specific beam flux and scanning profile according to another specific embodiment of this invention. This patterned implant cleave technology is more fully described in U.S. Pat. Nos. 6,290,804 and 6,248,649, commonly assigned, and hereby incorporated by reference herein, but can be others.

While the embodiment just described employs an expanded, stationary beam and X-Y scanning of the implant area, the present invention is not limited to this particular example. Alternative embodiments in accordance with the present invention could utilize a narrower beam, in conjunction with one or both of scanning movement of the beam itself, and physical movement of the tray. Again, the speed of movement of the beam and/or the tray could allow for implant in the entire target area, and averaging of beam flux over the implanted areas.

Figure 28:
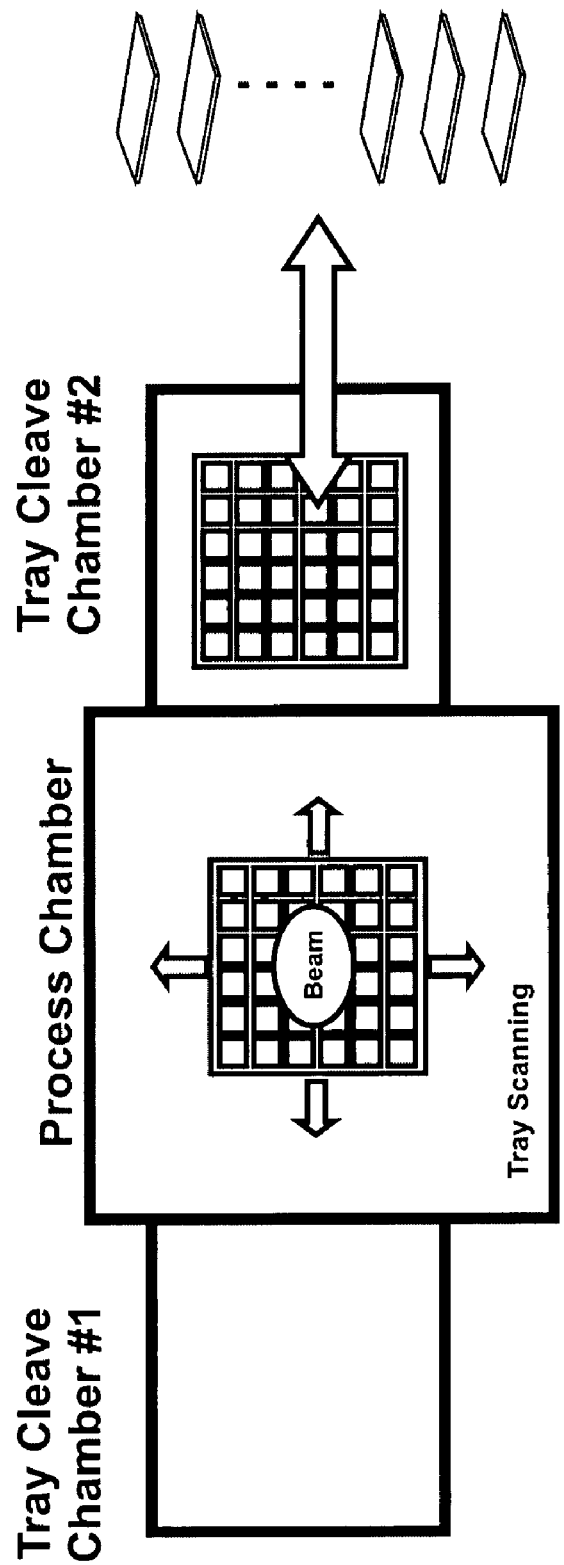
FIG. 28 is a simplified diagram of a cleaving process according to an embodiment of the present invention.

Once the dose has been integrated over the plurality of tiles within the tray being processed, the tray can be moved out of the process chamber and replaced by a new tray for processing according to the continuous implant process of this invention. The separation of the film may be made directly within a side chamber since if tile heating is used during the implant process, repeated heating and cooling may be avoided using such a technique. A possible method is shown in FIG. 28 and shows the use of alternating the implant and subsequent cleaving of thick tiles within multiple (e.g., 2) trays. In a specific embodiment, the continuous implant process is made by the alternating implantation of the tray chambers 1 & 2. In the Figure, tray from Tray Chamber #1 is being implanted while the previously implanted tray in Tray Chamber #2 is cleaved and made ready for a next implant process. The product of the process are the thin silicon layers cleaved and taken from the Tray Chamber #2. The surfaces of the tiles after cleaving may be of sufficient smoothness and general quality to allow a new implant and cleave process to occur without any surface preparation. Should some surface preparation be necessary (either at each implant/cleave cycle or after some predetermined number of implant/cleave cycles), the process can be made either in-situ or the tray taken outside the system and replaced with a surface processed tray. Of course, there can be other variations, modifications, and alternatives.

In a specific embodiment, the thickness of each tile will be a function of the cleaved thickness desired and the practical weight of the tray during processing. For example, a 100 um thick cleave layer allow somewhat less than 100 transfers per centimeter of starting tile material thickness before replacement with a new tile. It may be advantageous to have such thick films use a shaped tile of a thickness of many centimeters while a 20 um film process could have a tile of only a few centimeters. Infrequent tile replacement would allow many hours of continuous operation without interruption, thus increasing productivity and lowering process costs. Infrequent tray or tile external processing would also allow more efficient production by not requiring the cooling of the tiles from an implant temperature where such temperature changes would take time due to the relatively large thermal mass of the thick tiles. Of course, there can be other variations, modifications, and alternatives.

In accordance with one embodiment of the present invention, a high throughput of implanted material could be achieved. For example, in accordance with one embodiment, a tray having a form factor accommodating an 8×8 array of substrates having dimensions of 125 mm×125 mm, could be implanted with a dose of hydrogen of 1-2 E16 in about 15 minutes. According to this embodiment, therefore, a surface area of about 4 $m^2$ could be implanted in an hour.

Figure 29:
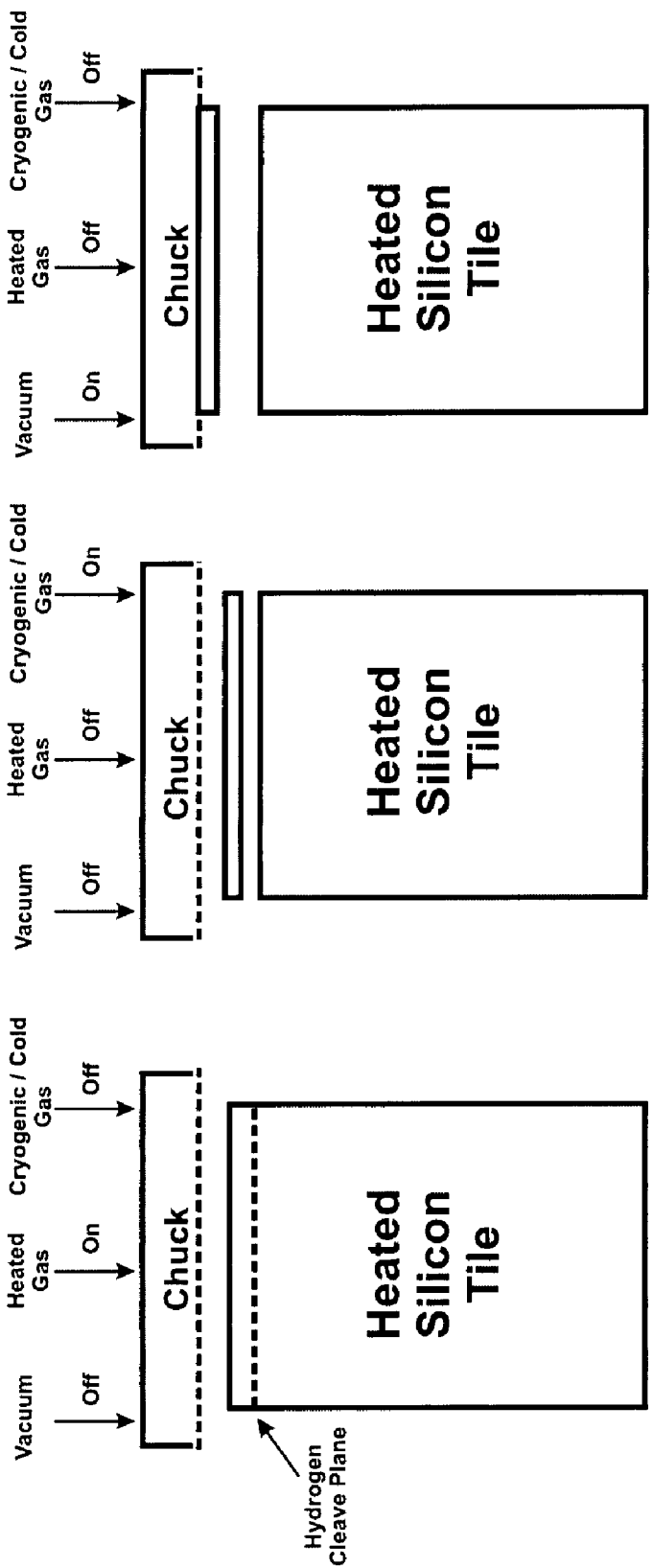
FIGS. 29a-c are simplified diagrams of a combination continuous implant and cleaving system according to an embodiment of the present invention.

The cleaving process according to this embodiment can be made using the layer-transfer process taught by Silicon Genesis Corporation, for example, as U.S. Pat. No. 6,013,563, commonly assigned, and hereby incorporated by reference for all purposes. According to the cleave method taught, the tile which may be heated from 200 C to 600 C can be removed from the implant process chamber after implantation with an appropriate hydrogen dose at the selected depth. For example, a 1 MeV H+ implant would allow approximately 16 um of silicon to be detached. Depending on the temperature during implant, the effective dose to allow cleaving after the implant process could range from 5e15 cm−2 to 5e17 cm−2. Once the tray is in the Tray Cleave Chamber, one or more of the tiles can be subjected to a separate anneal and cleave process to release the film. In a preferred embodiment, one or more or all tiles are simultaneously processed to release the films. FIG. 29 shows the cleaving and transfer of the film away from the heated tile according to one embodiment of this invention. The cleaving would occur during the heating of the tile where cold gas is injected to thermally stress the upper portion of the tile with sufficient energy to cause the cleaving of the film. In FIG. 29$a$, the chuck made of an appropriate material such as metal or ceramic with porous holes is brought into close proximity to the implanted tile surface. The distance of the chuck is small but the positive pressure of a heated gas would keep the chuck from contacting the surface. During this time, the gas can be chosen to prepare the post-implanted surface by the use of an etchant or other surface preparation gas to etch, passivate, or otherwise prepare the top surface of the tile which will become one surface of the detached film. For example, silicon etching gases such as SF6 or NF3 could be utilized to etch the tile surface while ozone, oxygen or nitrogen can be introduced to passivate the surface layer. Alternatively, the surface can be passivated using a plasma process, which includes nitrogen and/or oxygen bearing species. Depending upon the embodiment, the plasma process can include an implant component and/or plasma treatment component. Once the chuck is at a predetermined distance and as shown in FIG. 29$b$, a cold gas is injected into the gap to cause a sudden change in temperature and generate thermal stresses that cause the film to cleave from the remainder of the tile near the depth of the hydrogen cleave plane. Optionally, the tile temperature can be raised or lowered prior to this step. Once the film has been detached, FIG. 29$c$ shows the pick up process. Here, the cryogenic/cold gas is turned off and the vacuum is turned on to pick up and lift the loose, detached film from the tile. If no contact is desired, a bernouilli chuck configuration can also be used instead of vacuum to allow non-contact handling. An electrostatic chuck can also be used to hold the detached film. Obviously, if the cleave process utilizes gas and vacuum chucks, some limited pressures will be present within the tray cleave chambers. The use of purely thermal, mechanical and non-fluid energy pulses along with non-gas chuck holding methods such as electrostatic chucking can allow vacuum to remain within the tray cleave chamber. The application and cleave embodiments will be a function of the application.

All tiles can be simultaneously cleaved and films can be picked up by this technique, thereby allowing the tray to be re-introduced into the process chamber for another implant process according to a specific embodiment. The detached films can be gathered and brought outside of the implant/cleave system for further processing. Before the tray is brought back to the implant process and after the cleave tray has transferred the films to another tray (called a transfer tray for example and further explained below), the free cleave chuck surfaces can be used to prepare the post-cleave surfaces if desired.

Other cleaving techniques can be used instead of the above embodiment. For example, the cleaving can be made using a combination of thermal sink, thermal source and mechanical forces to cleave the film. The cleaving can also be made where the film is cleaved onto a suitable handle substrate that was bonded in a releasable or permanent way prior to the cleave process. Also, pure thermal cleaving can be practiced for example by raising the tile temperature sufficiently to allow the detachment within a predetermined time window. Scanning energy can also be used to allow the controlled initiation and propagation of the cleave process. For example, a timed release and progression of cryogenic gas from a first tile side to another would allow a propagating cleave to progress from the first side to the other side. A pulse of energy such as a laser or other directed energy source could also be used to initiate the cleaving action. This and other examples of cleave initiation and propagation can be found in U.S. Pat. No. 6,013,563, commonly assigned, and hereby incorporated by reference for all purposes. Other techniques can also be used, depending upon the embodiment.

In a specific embodiment using a cleave chamber concept, a method of forming substrates in a continuous process may be briefly outlined as follows:

1. Provide substrate members, each of the substrate members includes a plurality of tiles (e.g., reusable substrate (e.g., bulk silicon, bulk germanium, other materials) members);
2. Transfer a first substrate member including a first plurality of tiles from a first tray cleave chamber onto a process chamber in a vacuum environment;
3. Maintain the first substrate member in the vacuum environment
4. Subject the first plurality of tiles to a scanning implant process;
5. Complete the scanning implant process for the first plurality of tiles;
6. Transfer the first substrate member including the implanted first plurality of tiles to the first tray cleave chamber;
7. Transfer a second substrate member including a second plurality of tiles from a second tray cleave chamber onto a process chamber in a vacuum environment;
8. Subject the second plurality of tiles to the scanning implant process;
9. Process the first substrate member including the implanted first plurality of tiles to an optional surface preparation and a cleaving process to detach and hold the detached plurality of transferred films.
10. Optionally process the cleaved surface of the first plurality of tiles to prepare the surface for the next implant process.
11. Remove the second substrate member including the implanted second plurality of tiles to the second tray cleave chamber upon completion of the scanning implant process;
12. Transfer the first substrate member including the first plurality of tiles from the first tray cleave chamber onto the process chamber in a vacuum environment;
13. Subject the first plurality of tiles to the scanning implant process;
14. Process the second substrate member including the implanted second plurality of tiles to an optional surface preparation and a cleaving process to detach and hold the detached plurality of transferred films.
15. Optionally process the cleaved surface of the second plurality of tiles to prepare the surface for the next implant process.
16. Repeat the implant/cleave steps alternatively on the first and second substrate member and including other substrates as desired; and
17. Perform other steps, as desired.

As shown, the present method includes steps to carry out an implant technique. As an example, the transferred films held by the tray be given in turn to another tray (called a transfer tray) using a transfer process where, for example, the plurality of cleave chuck elements holding the films are placed in proximity to the exposed film surfaces. The vacuum of the transfer tray chucks are turned on as the vacuum from the cleave chucks are turned off, thereby effectuating a transfer of the films from the cleave tray onto the transfer tray. The transfer tray can then be exited from the system holding the detached films through a load lock system. The cleave chuck is thereby free to process the substrate member before it is transferred back into the implant process chamber. For example, the cleave chuck can be placed back in proximity to the cleaved tiles surfaces and an etchant or other surface preparation gas can be injected to perform the surface preparation step. Of course, there can be other variations, modifications, and alternatives.

In a specific embodiment, the transferred films may also be processed to limit fragility and breakage by edge, surface etching or polishing. Although these films are free-standing, microcracks or nanodefects can significantly lower the strength of the material and lead to film breakage. Before photovoltaic processing or release as a free-standing film, etching pr polishing steps may therefore be necessary. Depending upon the embodiment, certain steps can be added, combined, or expanded. Of course, there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. Alternatively or in addition, phosophorous may be replaced by other N-type impurities such as arsenic, and others. For example, the process can be modified by (i) extending the ion shower head to have two concurrent shower heads, each implanting one of the two species in succession, (ii) using one shower head and implanting the first species and the second species successively (using species, energy, and total dose through a modified second scan rate and scanning the substrate a second time or selecting a second implant tile/wafer temperature), and (iii) using a true co-implant process where both species are co-implanted concurrently through the same ion shower head. Of course there can be other variations, modifications, and alternatives. Therefore, the above description and illustrations should not be taken as limiting the scope of the present invention which is defined by the appended claims.

What is claimed is:

1. A method for forming substrates using a continuous implant process, the method comprising:
providing a movable track member, the movable track member being provided within a chamber, the chamber including an inlet port, an outlet port and a process chamber;
maintaining a first substrate including a first plurality of tiles in the inlet port, the chamber being maintained in a vacuum environment;
transferring the first substrate including the first plurality of tiles from the inlet port onto the movable track member;
subjecting the first plurality of tiles to a first implant process using a scanning implant process, while the chamber including the first plurality of tiles being maintained in a vacuum environment;

maintaining a second substrate including a second plurality of tiles in the inlet port, the inlet port being maintained in a vacuum environment while the first plurality of tiles are being implanted;

transferring the second substrate including a second plurality of tiles from the inlet port onto the movable track member; and subjecting the second plurality of tiles to a second implant process using the scanning implant process.

2. The method of claim 1 wherein the inlet port and the outlet port are provided by load lock systems coupled to the chamber.

3. The method of claim 1 wherein the scanning implant process forms a thickness of material defined by a cleave plane within a thickness of each of the tiles on the first substrate.

4. The method of claim 1 wherein the scanning implant process forms a thickness of material defined by a cleave plane within a thickness of each of the tiles on the second substrate.

5. The method of claim 1 wherein the first plurality of tiles and the second plurality of tiles are respectively subjected to a controlled cleaving process after the scanning implant process.

6. The method of claim 1 wherein the scanning implant process includes movement of an implant beam.

7. The method of claim 1 wherein the scanning implant process is provided by spatial movement of the first substrate by the movable track member.

8. The method of claim 1 wherein the first substrate comprises a tray device.

9. The method of claim 1 wherein the movable track member includes a plurality of rollers, air bearing, or movable track.

10. The method of claim 1 wherein the scanning implant process includes a co-implant of hydrogen and helium species.

11. The method of claim 1 wherein the scanning implant process includes a hydrogen implant process and a helium implant process.

12. The method of claim 1 wherein the scanning implant process includes a first helium implant process and a hydrogen implant process.

13. The method of claim 1 wherein the scanning implant process comprises a high energy implant process to cause formation of a thickness of material defined by a cleave plane within a thickness of each of the tiles, the thickness of material being at least 500 nanometers as provided by the high energy implant process.

14. The method of claim 1 wherein the scanning implant process comprises a first implant process and a second implant process.

15. The method of claim 1 further comprising maintaining a mask to shield a peripheral region of each of the plurality of tiles.

16. The method of claim 1 further comprising subjecting each of the tiles to a thermal process to heat each of the tiles during the scanning implant process.

17. The method of claim 1 further comprising subjecting each of the tiles to a thermal process to heat each of the tiles during the scanning implant process, the thermal process being selected from conduction, infra-red radiation, convection, or combination of these.

18. The method of claim 1 wherein the chamber is coupled to another chamber for implanting species into each of the tiles.

19. The method of claim 1 wherein the first plurality of tiles and the second plurality of tiles are respectively subjected to a thermal separation process after the scanning implant process.

20. The method of claim 1 wherein the first plurality of tiles and the second plurality of tiles are respectively subjected to a porous silicon separation process after the scanning implant process.

21. The method of claim 1 wherein the scanning implant process forms at least one impurity regions within a thickness of each of the tiles on the first substrate.

22. The method of claim 1 wherein the scanning implant process forms at least one impurity regions within a thickness of each of the tiles on the second substrate.

23. The method of claim 1 wherein the scanning implant process provides a P type impurity species in a thickness of each of the first plurality of tiles and in a thickness of each of the second plurality of tiles, the P type impurity species include a boron species or others.

24. The method of claim 1 wherein the scanning implant process provides implant of a N type impurity species in a thickness of each of the first plurality of tiles and in a thickness of each of the second plurality of tiles, the N type impurity species include a phosphorus species, an antimony species, an arsenic species, or others.

25. The method of claim 1 wherein:
subjecting the first plurality of tiles to a first implant process comprises subjecting the first plurality of tiles to implantation including at least a hydrogen bearing species using a scanning implant process operable at a high energy range greater than a first determined amount suitable to form a free standing thickness of material cleaved from at least one of the first plurality of tiles, while the chamber including the first plurality of tiles being maintained in a vacuum environment; and subjecting the second plurality of tiles to a second implant process comprises subjecting the second plurality of tiles to implantation including at least a hydrogen bearing species using the scanning implant process operable at the high energy range greater than the first determined amount.

26. The method of claim 25 wherein the first determined amount ranges from about 550 keV to about 5 MeV for the first implant process; and wherein the first plurality of tiles are composed of a silicon material.

27. The method of claim 25 wherein the first determined amount ranges from about 550 keV to about 5 MeV for the first implant process; and wherein the first plurality of tiles are composed of a single crystal silicon material.

28. The method of claim 25 wherein the hydrogen bearing species is substantially H+ or H2+ or H3+.

29. The method of claim 1 wherein each of the first plurality of tiles comprises a surface region having a screen layer to screen one or more contaminants.

30. The method of claim 1 further comprising subjecting the plurality of first tiles to a thermal process after the first scanning implant process.

31. The method of claim 1 wherein the first scanning implant process maintains a substantially constant power density.

* * * * *